United States Patent
Lim et al.

(10) Patent No.: US 10,725,672 B2
(45) Date of Patent: *Jul. 28, 2020

(54) MEMORY MODULE, MEMORY CONTROLLER AND SYSTEMS RESPONSIVE TO MEMORY CHIP READ FAIL INFORMATION AND RELATED METHODS OF OPERATION

(71) Applicant: Samsung Electronics Co., Ltd., Suwon-si (KR)

(72) Inventors: Sun-young Lim, Hwaseong-si (KR); Young-jin Cho, Seoul (KR); Jang-seok Choi, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/236,750

(22) Filed: Dec. 31, 2018

(65) Prior Publication Data

US 2019/0138230 A1 May 9, 2019

Related U.S. Application Data

(63) Continuation-in-part of application No. 15/688,120, filed on Aug. 28, 2017, now Pat. No. 10,169,126.
(Continued)

(30) Foreign Application Priority Data

Jan. 4, 2017 (KR) .......................... 10-2017-0001318

(51) Int. Cl.
*G11C 7/00* (2006.01)
*G06F 3/06* (2006.01)

(52) U.S. Cl.
CPC .......... *G06F 3/0619* (2013.01); *G06F 3/0655* (2013.01); *G06F 3/0679* (2013.01)

(58) Field of Classification Search
CPC . G11C 29/50; G11C 11/401; G11C 29/29102; G11C 29/34; G11C 29/42; G11C 29/4401
(Continued)

(56) References Cited

U.S. PATENT DOCUMENTS 4,964,129 A * 10/1990 Bowden, III ......... G06F 11/073
714/704
6,986,072 B2 1/2006 Nishio et al.
(Continued)

*Primary Examiner* — Son T Dinh
(74) *Attorney, Agent, or Firm* — Muir Patent Law, PLLC

(57) ABSTRACT

A memory module for reporting information about a fail in chip units, an operation of a memory module, and an operation of a memory controller are provided. The memory module includes: first to Mth memory chips (where M is an integer that is equal to or greater than 2) mounted on a module board and storing data, and an (M+1)th memory chip mounted on the module board and storing a parity code for recovering data of a memory chip in which a fail in chip units occurs among the first to Mth memory chips, wherein fail bits are generated from the first to (M+1)th memory chips through an intra-chip error detection operation, and fail information is output according to a result of calculating the fail bits from the first to (M+1)th memory chips.

20 Claims, 20 Drawing Sheets

Related U.S. Application Data

(60) Provisional application No. 62/406,969, filed on Oct. 12, 2016.

(58) Field of Classification Search
USPC .......................................... 365/201, 189.12
See application file for complete search history.

(56) References Cited

U.S. PATENT DOCUMENTS

| | | |
|---|---|---|
| 7,043,679 B1 | 5/2006 | Ketlcher et al. |
| 7,320,086 B2 | 1/2008 | Majni et al. |
| 7,444,540 B2 | 10/2008 | Shaw |
| 8,078,938 B2 | 12/2011 | Kawabata |
| 8,468,422 B2 | 6/2013 | Chessin et al. |
| 8,732,532 B2 | 5/2014 | Higeta |
| 10,169,126 B2 * | 1/2019 | Lim ..................... G06F 3/0619 |
| 2015/0067437 A1 | 3/2015 | Bains et al. |
| 2016/0224412 A1 | 2/2016 | Hu et al. |
| 2016/0132265 A1 | 5/2016 | Yi et al. |
| 2016/0055059 A1 | 8/2016 | Healy et al. |

* cited by examiner

MEMORY MODULE, MEMORY CONTROLLER AND SYSTEMS RESPONSIVE TO MEMORY CHIP READ FAIL INFORMATION AND RELATED METHODS OF OPERATION

CROSS-REFERENCE TO RELATED APPLICATION

This application is a Continuation-in-Part of U.S. patent application Ser. No. 15/688,120, filed on Aug. 28, 2017 in the USPTO which claims the benefits of U.S. Patent Provisional Application No. 62/406,969, filed on Oct. 12, 2016, in the USPTO, Korean Patent Application No. 10-2017-0001318, filed on Jan. 4, 2017 in the Korean Intellectual Property Office, the disclosures of which are incorporated herein in their entireties by reference.

BACKGROUND

The inventive concept relates to a memory module, and more particularly, to a memory module reporting failure of read operations of memory chips thereon, a method of operating a memory module, and a method of operating a memory controller.

As the operating speed of a semiconductor memory device increases, the probability of error occurrence of data increases. As an example of correcting an error, a method of recovering an error in chip units has been proposed. In this case, a memory controller generates a parity code (for example, an error correction code) corresponding to data of a predetermined unit of bits and stores the data and the parity code in a semiconductor memory device (e.g., a memory package, a memory module, etc.) including a plurality of memory chips. Upon reading the predetermined unit of data, and erroneous data may be recovered through a recovery algorithm using read data and the parity code. However, a number of memory chips increases in order to store the parity code, thereby increasing the cost of the semiconductor memory device.

SUMMARY

The inventive concept provides a memory module, memory controller and system with error detection and correction capability with reduced manufacturing cost.

The inventive concept provides a method of operating a memory module.

The inventive concept also provides a method of operating a memory controller.

According to an aspect of the inventive concept, there is provided a memory module including: first to Mth memory chips (where M is an integer that is equal to or greater than 2) mounted on a module board and storing data; and an (M+1)th memory chip mounted on the module board and storing a parity code for recovering data of a memory chip in which a fail in chip units occurs among the first to Mth memory chips, wherein fail bits are generated from the first to (M+1)th memory chips through an intra-chip error detection operation, and fail information is output according to a result of calculating the fail bits from the first to (M+1)th memory chips.

According to another aspect of the inventive concept, there is provided a memory module including: M dynamic random access memory (DRAM) chips (where M is an integer that is equal to or greater than 2), each of which includes an in-DRAM error correction circuit (In-DRAM ECC) and generates a fail bit, which indicates whether a fail in chip units occurs, through internal error detection; and a buffer chip that receives the fail bits from the M DRAM chips and generates and outputs fail information through a calculation operation on the fail bits.

According to another aspect of the inventive concept, there is provided a method of operating a memory controller, the method including: receiving data and a parity code corresponding thereto from a plurality of memory chips; receiving fail information indicating that at least one of the plurality of memory chips has failed; requesting provision of a fail bit indicating a position of a failed memory chip among the plurality of memory chips; and recovering data of the failed memory chip by using the fail bit and the parity code.

According to another aspect of the inventive concept, there is provided a method of operating a memory module, the method including: reading data stored in a plurality of memory chips and a parity code for recovering fails of the plurality of memory chips; generating, from each of the plurality of memory chips, a fail bit, which indicates whether a fail in chip units occurs, through an intra-chip error detection operation; and outputting fail information generated through calculation on the fail bits generated from the plurality of memory chips.

According to the memory module, the method of operating the memory module, and the method of operating the memory controller, data of a failed memory chip may be recovered without generating a detection code indicating the position of the failed memory chip, and thus, manufacturing cost of the memory module may be reduced.

In addition, without storing a separate detection code in a memory chip, data of a fail chip may be recovered and a random error and/or a multi-bit error may be corrected, and thus, the error correction capability of a semiconductor memory device may be improved.

According to another aspect of the inventive concept, there is provided a memory module including: first to Mth memory chips (where M is an integer that is equal to or greater than 2), each of which includes an in-memory error correction circuit to generate a fail bit through an intra-chip error detection operation; and a buffer chip that receives the fail bits from the first to Mth memory chips and reports to a host whether at least one of the first to Mth memory chips fails, based on the fail bits.

According to another aspect of the inventive concept, there is provided a memory module including: first to Mth memory chips (where M is an integer that is equal to or greater than 2), each of which includes an in-memory error correction circuit to generate a fail bit through an intra-chip error detection operation; and a control chip that to receive the fail bits in addition to receiving data and a parity code from the first to M memory chips, to recover a failed memory chip among the first to Mth memory chips based on the fail bits, and to provide repaired data to a host.

According to another aspect of the inventive concept, there is provided a method of operating a memory module including a plurality of memory chips, each of the plurality of memory chips including an in-memory error correction circuit, the method including: reading data and a parity code from the plurality of memory chips; generating fail bits indicating whether the plurality of memory chips fail; recovering, by a control chip included in the memory module, data of a failed memory chip determined based on the fail bits, by using the read data and the parity code; and providing the repaired data to a host.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
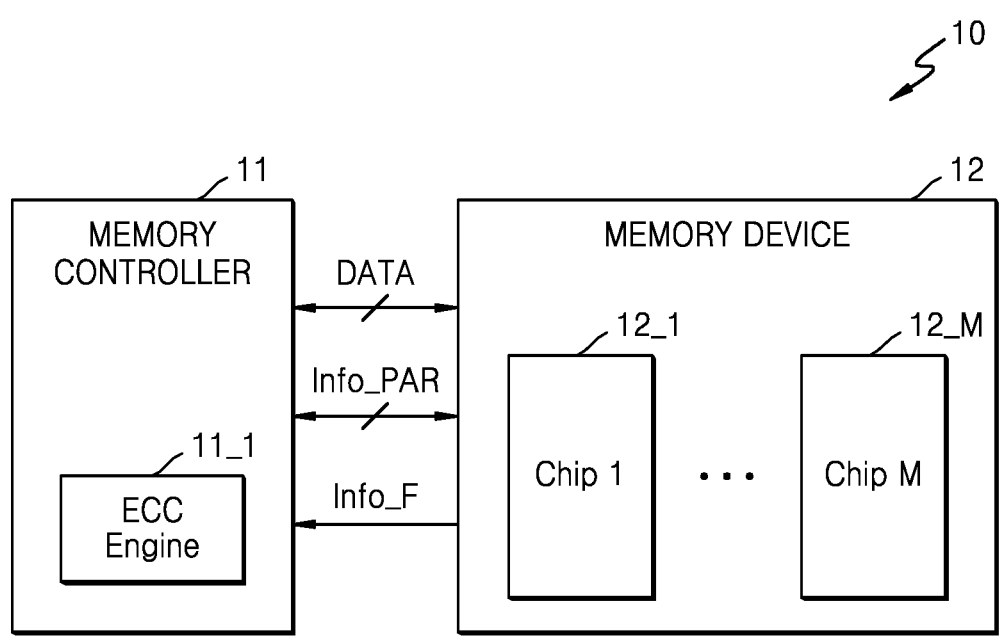
FIG. 1 is a diagram illustrating a memory system according to an exemplary embodiment of the inventive concept.

Hereinafter, embodiments of the inventive concept will be described in detail with reference to the accompanying drawings. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a diagram illustrating a memory system 10 according to an exemplary embodiment of the inventive concept. The memory system 10 comprises a memory controller 11 and a semiconductor memory device 12, and the semiconductor memory device 12 may include a plurality of memory chips 12_1 to 12_M. As an example, each of the plurality of memory chips 12_1 to 12_M of the semiconductor memory device 12 may be a dynamic random access memory (DRAM) chip or another type of a volatile memory chip. The DRAM chip may be a Double Data Rate Synchronous Dynamic Random Access Memory (DDR SDRAM), Low Power Double Data Rate (LPDDR) SDRAM, Graphics Double Data Rate (GDDR) SDRAM, or Rambus Dynamic Random Access Memory (RDRAM). However, embodiments of the inventive concept are not limited thereto. For example, the semiconductor memory device 12 may be implemented with a non-volatile memory chips such as a flash memory, Magnetic RAM (MRAM), Ferroelectric RAM (FeRAIVI), Phase Change RAM (PRAM), or Resistive RAM (ReRAM). Each of the memory chips 12_1 to 12_M may correspond to a DRAM chip according to various standards such as DDR, DDR2, DDR3, DDR4, and DDR5.

In the following description, each of the memory chips 12_1 to 12_M is referred to as a DRAM chip. However, the memory chips 12_1 to 12_M may be implemented with chips of various other types (for example, non-volatile memory) and the description is equally applicable to these implementations.

According to an embodiment, the semiconductor memory device 12 may correspond to a semiconductor package having a structure in which the plurality of DRAM chips 12_1 to 12_M are stacked on a package substrate (e.g., chips 12_1 to 12_M encased in a molding resin material of the semiconductor package and in communication with external sources through terminals of the package substrate). Alternatively, according to an embodiment, the semiconductor memory device 12 may correspond to a memory module in which the plurality of DRAM chips 12_1 to 12_M are mounted on a module board with several semiconductor packages, with each semiconductor package including one or several of the chips 12_1 to 12_M (each generically referred to via reference numeral 12_n). Although one semiconductor memory device 12 is shown in FIG. 1, the memory controller 11 may communicate with a plurality of such semiconductor memory devices 12 to write or read data DATA thereto or therefrom. Although the semiconductor memory device 12 is described as being a memory module in the following embodiments, the semiconductor memory device 12 may include various types of memory devices (for example, a memory package, etc.) including a plurality of DRAM or other types of memory chips, as described above.

The memory controller 11 provides various signals to the semiconductor memory device 12 to control a memory operation. For example, the memory controller 11 may provide data DATA and parity information Info_PAR to the semiconductor memory device 12 and may read data DATA and parity information Info_PAR from the semiconductor memory device 12. The memory controller 11 may include an error correction code (ECC) engine 11_1, and the ECC engine 11_1 may correct an error included in the data DATA through an error correction operation using the data DATA and the parity information Info_PAR. The memory controller 11 may be a semiconductor device comprising one or more semiconductor chips and interface with a host computer, such as an application processor (not shown), to control memory access requests by the host. Alternatively, the memory controller may be implemented by the host itself, and the host may include a central processing unit (CPU) for performing all processing operations and a control module (corresponding to the disclosed memory controller 11) for accessing the semiconductor memory device 12.

The parity information Info_PAR may include various pieces of information related to error correction and/or recovery of data stored in a failed chip ("failed chip" as used herein refers to a chip having a failure in providing error free data as part of a particular read operation and does not indicate that the chip is not operable or otherwise indicate that the general functioning of the chip should be considered deficient—a chip may be considered a "failed chip" with respect to one read operation and not considered a "failed chip" with respect to a subsequent read operation). According to an embodiment, a parity code for error correction and/or recovery of erroneous data of a failed chip may be included in the parity information Info_PAR. The parity information Info_PAR may comprise a detection code for detecting a position where an error has occurred with respect to data stored by a failed chip may be for error correction and/or recovery of a failed chip. As will be appreciated, error correction of data having a bit error may comprise determining (or detecting) a position the erroneous bit within the data (e.g., determining that the erroneous bit is the $i^{th}$ bit of an n-bit unit of data to which the parity code is associated, i being an integer between 1 to n). In certain implementations, the parity code may be used to determine positions of plural erroneous bits within the data with which it is associated.

According to an embodiment, an error correction circuit (not shown in FIG. 1) may be employed in each of the DRAM chips 12_1 to 12_M, so that, for each of the DRAM chips 12_n, the on-chip ECC is formed as part of the same integrated circuit forming the DRAM chip 12_n. Such an on-chip ECC will be referred to herein as an In-DRAM ECC when implemented with a DRAM chip, but it should be appreciated that the related descriptions regarding In-DRAM ECC are equally applicable to on-chip ECC implemented with memory chips 12_n other than DRAM. Thus, each of the DRAM chips 12_1 to 12_M may perform chip level error detection/correction and may correct certain errors of data internal to the DRAM chip in which the In-DRAM ECC resides. Each DRAM chip 12_n may also generate information (for example, generate a "fail bit") indicating error free data or that error correction of certain data of that DRAM chip 12_n was not possible, in accordance with an error detection result of the In-DRAM ECC of that DRAM chip 12_n. For example, each DRAM chip 12_n may generate a "fail bit" to indicate whether data read by the DRAM chip 12_n and/or provided by the DRAM chip 12_n to memory controller 11 contains an error that is not correctable by the DRAM chip 12_n (e.g., by the In-DRAM ECC of the DRAM chip 12_n) or to indicate that the data read by the DRAM chip 12_n is considered by the DRAM chip 12_n to be error free. For example, the fail bit may have a first logic value (or first logic state, such as logic low or "0") indicating that correction of certain read data of the DRAM chip 12_n was not possible by the corresponding In-DRAM ECC and which may have a second logic value (or second logic state, such as logic high or "1") indicating that certain read data is considered error free (either stored and read error free or having been read with one or more bit errors that were corrected by the In-DRAM ECC). Thus, when providing multi-chip data DATA having portions stored in each of the M DRAM chips 12_1 to 12_M, the semiconductor memory device 12 may provide M fail bits each indicating fail states (such as indicating uncorrected erroneous data or error free data) of the respective portion of data DATA provided by the M DRAM chips 12_1 to 12_M to memory controller 11.

According to an embodiment, the semiconductor memory device 12 may generate fail information Info_F by analyzing the M fail bits and output the generated fail information Info_F to the memory controller 11. The fail information Info_F may indicate that multi-chip data DATA (having portions stored in each of the M DRAM chips 12_1 to 12_M) is considered error free or that one or more of the M DRAM chips 12_1 to 12_M has provided a portion of the data DATA that has an error that is not correctable by that DRAM chip. The fail information Info_F may be generated according to various methods. As an example, fail bits corresponding to M bits may be generated from M DRAM chips 12_1 to 12_M in the semiconductor memory device 12 and fail information Info_F may be generated based on the result of a calculation using the fail bits. For example, the fail information Info_F may be generated by performing an XOR operation on the M fail bits, and thus, when at least one of the DRAM chips 12_1 to 12_M fails, the fail information Info_F may have a first logic state (e.g., logic high). On the other hand, when the DRAM chips 12_1 to 12_M fail, the fail information Info_F may have a second logic state (e.g., logic low).

The semiconductor memory device 12 may provide the fail information Info_F to the memory controller 11 (which may be a separate semiconductor device or part of a host), and the memory controller 11 may determine which DRAM chip in the semiconductor memory device 12 failed, which may be based on the fail information Info_F or may be based on further analysis of the M fail bits. The ECC engine 11_1 of the memory controller 11 may perform an error correction operation of the data portion provided by the failed chip(s) to correct data DATA and the memory controller 11 may provide the corrected data to an external source (such as the host) that requested the same. The memory controller 11 may also perform a write operation of the corrected data portion to the failed chip(s) to correct the data stored therein. The ECC engine 11-1 may use the parity information Info_PAR to perform such error correction and be responsive to the fail information Info_F in determining whether to perform the error correction operation or forgo such an error correction operation. The error detection/correction operation in the memory controller 11 may correspond to a module level or system level error detection/correction operation to correct multi-chip data DATA stored in multiple chips (which may be some or all of the memory chips of the semiconductor memory device 12) and the Info_PAR may thus correspond to data DATA stored in multiple chips of the semiconductor memory device 12.

For example, when the fail information Info_F indicates that there is no failed DRAM chip 12_n in connection with a read operation of DATA from semiconductor memory device 12, the ECC engine 11_1 may forgo performing any analysis (e.g., error detection) and/or correction of the data DATA. As an example, the parity information Info_PAR may comprise a code for performing a data recovery operation to correct up to a predetermined number of erroneous bits of the data DATA (for example, correcting one bit or up to two bits of erroneous bits). When there is no failed DRAM chip, the data recovery operation may not be performed. Further, when the fail information Info_F indicates that there is at least one failed DRAM chip, the ECC engine 11_1 may recover data of the failed DRAM chip through a data recovery operation using the parity information Info_PAR. Accordingly, the memory controller 11 may receive a report (for example, in the form of fail information Info_F) on a fail state of the DRAM chips 12_1 to 12_M of the semiconductor memory device 12 and selectively perform a data recovery operation on a failed chip according to a result of the report. The memory controller 11 may also selectively perform error detection as a function of the report.

In embodiments of the inventive concept, a data recovery operation performed on a failed chip may be performed by various error correction algorithms. For example, the memory controller 11 may recover data of a failed chip through a data recovery scheme based on various ways such as a Reed-Solomon Error Correction Code.

As part of a writing operation to semiconductor memory device 12, memory controller 11 may generate an error correction code comprising parity information Info_PAR through internal coding (e.g., ECC coding) for a predetermined unit of data (e.g., 32 or 64 bits of data which may correspond to data DATA) to be stored by multiple ones of DRAM chips 12_n (herein referred to as "multi-chip data" of which data DATA is an example). According to an embodiment of the inventive concept, the parity information Info_PAR may include a parity code used for a data recovery. However, parity information Info_PAR may not comprise a detection code sufficient to detect the position of or otherwise identify a failed chip. That is, the Info_PAR may comprise a parity code that is insufficient to identify a failed chip from a group of DRAM chips 12_n that store the multi-chip data (subsequent to the writing operation) during a subsequent read operation of the multi-chip data. In writing the multi-chip data (e.g., DATA) to the semiconductor memory device 12, the memory controller 11 may also write Info_PAR to the semiconductor memory device 12 and not write any detection code for sufficient to identify a failed chip to the semiconductor memory device 12. For example, parity information Info_PAR may be a parity code sufficient to correct up to a certain number of erroneous bits of the multi-chip data DATA when the failed chip(s) has been identified, but may be insufficient to identify and correct which bit(s) of the multi-chip data DATA is/are erroneous when the identity of the failed chip(s) (or other information indicating the portion of the multi-chip data DATA that has the erroneous bit(s)) is not also provided. Accordingly, the memory controller 11 may only generate a parity code through an encoding process for a predetermined unit of data. If a 4-bit detection code is required to detect which bit of 64-bit data is erroneous, such a 4-bit detection code does not have to be generated or stored according to an embodiment of the inventive concept, and thus, resources (e.g., a DRAM chip or a storage area of a DRAM chip) for storing the detection code may be reduced.

Alternatively, according to a modified embodiment, the memory controller 11 may generate both a parity code and additional detection code through encoding for the predetermined unit of data. On the other hand, as the memory controller 11 stores only the parity code in the semiconductor memory device 12, resources for storing the additional detection code in the semiconductor memory device 12 may be reduced. The additional detection code may be discarded after its generation without further storage.

Further, according to a modified embodiment, the memory controller 11 may generate a parity code for data recovery of a failed chip and code information for additional error correction through encoding for the predetermined unit of data. The code information may be stored in a resource that otherwise may have stored a larger detection code in the semiconductor memory device 12. That is, according to the present modified embodiment, code information for additional error correction (e.g., random error and/or multi-bit error correction) may be stored in the semiconductor memory 12 without increasing resources for storing codes or various kinds of information, and thus, the data reliability of the semiconductor memory device 12 may be improved.

According to an exemplary embodiment of the inventive concept, the parity code may comprise a code for correcting at least one bit error for data recovery of a failed chip. In addition, additional code information may be included as part of the parity code.

Further, according to a modified embodiment, since the memory controller 11 may receive an error state reported from the semiconductor memory device 12 to identify which of the DRAM chips 12_n is a failed chip(s), the memory controller 11 may generate a detection code having a smaller size through encoding for the predetermined unit of multi-chip data. As an example, among various types of encoding methods, an encoding method capable of reducing the size of the detection code may be applied to the memory controller 11, and a detection code having the reduced size may be stored in the semiconductor memory device 12. For example, in performing an encoding operation of a predetermined unit of multi-chip data (e.g., as part of a write operation of such data), memory controller 11 may generate a detection code having a size (e.g., 2 bits) that is smaller than that of a 4-bit detection code (e.g., sufficient for identification of an erroneous bit without requiring identification of the failed chip). The 2-bit detection code may be stored in the semiconductor memory device 12 upon storing the predetermined unit of multi-chip data, and thus, the code information for additional error correction described above or other information (e.g., index or tag information when the semiconductor memory device 12 is used as a cache) may be stored in resources that may be additionally utilized. The 2-bit detection code may be insufficient by itself to identify which chip contains an erroneous bit upon a subsequent read of the predetermined unit of multi-chip data having at least one bit error. However, the 2-bit detection code may be sufficient to identify a location of an erroneous bit and thus correct the same of the same erroneous multi-chip data upon a failed chip being identified by other means, as described herein.

According to the embodiment shown in FIG. 1, since a larger, more robust, detection code for determining the position of a failed chip does not need to be stored, the number of DRAM chips provided in the semiconductor memory device 12 may be reduced. In addition, since resources for storing a larger, more robust, detection code may be utilized as resources for storing code information for additional error detection and correction (e.g., random error or multi-bit error correction), the data reliability of the memory system 10 may be improved.

Figure 2:
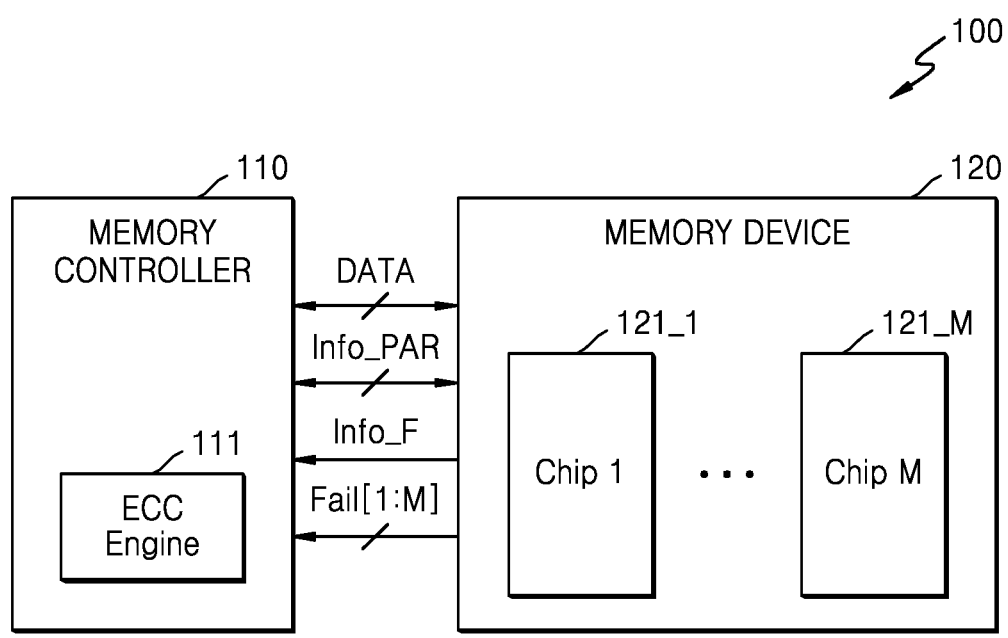
FIG. 2 is a diagram illustrating a memory system according to another exemplary embodiment of the inventive concept.

FIG. 2 is a diagram illustrating a memory system 100 according to another exemplary embodiment of the inventive concept. A configuration the memory system 100 shown in FIG. 2 is substantially the same as that of the memory system 10 shown in FIG. 1, and thus, operations of the memory system 100 that are the same as that of the memory system 10 will be not described in detail.

Referring to FIG. 2, the memory system 100 may include a memory controller 110 and a semiconductor memory device 120, and the semiconductor memory device 120 may include DRAM chips 121_1 to 121_M. In addition, the memory controller 110 may include an ECC engine 111.

As in the embodiment described above, each of the DRAM chips 121_1 to 121_M may include an In-DRAM ECC (not shown) and may generate a fail bit, which indicates that an error was detected in read data of that DRAM chip 121_n but that error correction was not possible through a chip level error detection operation on read data (and/or indicates that an error remains in the read data). M fail bits Fail [1:M] may be generated from the group of DRAM chips 121_1 to 121_M of the semiconductor memory device 120, and fail information Info_F may be generated through a calculation operation using the M fail bits Fail [1:M] and be output to the memory controller 110.

According to an embodiment, a case where M fail bits Fail [1:M] are generated from the semiconductor memory device 120 as one fail bit is generated from each of the DRAM chips 121_1 to 121_M according to an embodiment has been described. However, embodiments of the inventive concept are not limited thereto. For example, when two or more fail bits are generated from each of the DRAM chips 121_1 to 121_M, or a fail bit is generated only in some (for example, DRAM chips storing data) of the DRAM chips 121_1 to 121_M, the number of fail bits that are generated in the semiconductor memory device 120 may be changed.

Also, according to an embodiment, the fail information Info_F generated through the calculation operation using the M fail bits Fail [1:M] may correspond to one bit. Alternatively, when the calculation operation using the M fail bits Fail [1:M] is performed through various other calculation processes, the fail information Info_F may include a different number of bits.

In the embodiment illustrated in FIG. 2, the semiconductor memory device 120 may output the fail information Info_F together with multi-chip data DATA and parity information Info_PAR to the memory controller 110. Assuming that one or more general errors may be corrected through the parity information Info_PAR, when a fail in chip units does not occur in the DRAM chips 121_1 to 121_M, the memory controller 110 may skip error detection (and also error correction) to detect and correct one or more general errors in the data DATA through a general correction operation using the received parity information Info_PAR. On the other hand, when the fail information Info_F has a first logic level, the memory controller 110 may determine that at least one DRAM chip failed, and may provide a command to the semiconductor memory device 120 and read the fail bits Fail [1:M] stored in the semiconductor memory device 120. The memory controller 110 may identify which DRAM chip is a failed chip and thus a range of positions (or range of bits) in which the erroneous bit(s) may exist within the multi-chip data DATA based on the fail bits Fail [1:M], and may recover data DATA of a failed DRAM chip by using the fail bits Fail [1:M] and the parity information Info_PAR.

Figure 3:
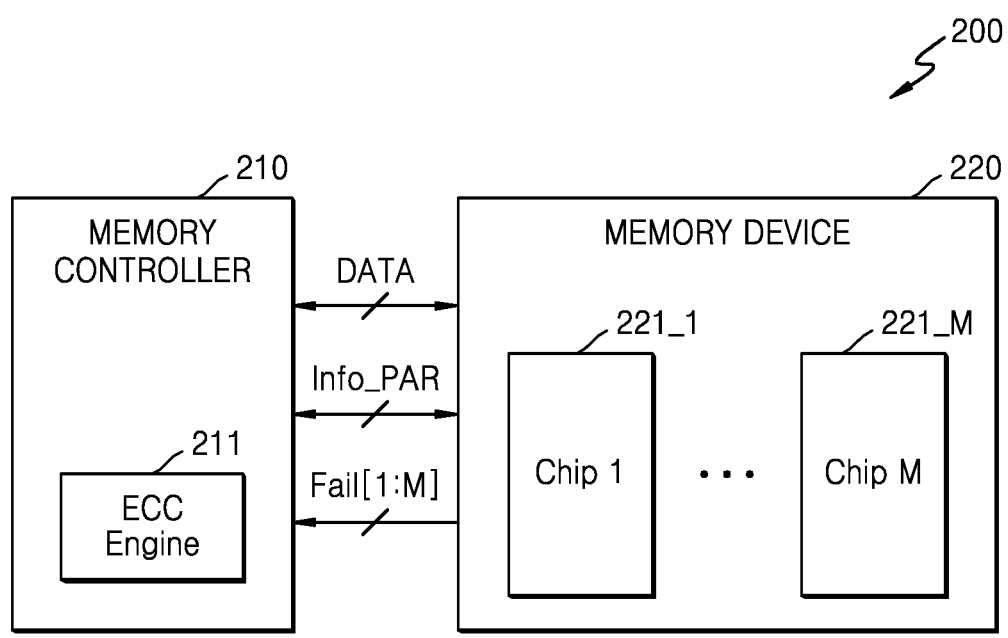
FIG. 3 is a diagram illustrating a memory system according to another exemplary embodiment of the inventive concept.

FIG. 3 is a diagram illustrating a memory system 200 according to another exemplary embodiment of the inventive concept. A configuration the memory system 200 shown in FIG. 3 is substantially the same as those of the memory systems 10 and 100 shown in FIGS. 1 and 2, and thus, an operation of the memory system 200, which is substantially the same as that those of the memory systems 10 and 100, will be not described in detail.

Referring to FIG. 3, the memory system 200 may include a memory controller 210 and a semiconductor memory device 220, and the semiconductor memory device 220 may include M DRAM chips 221_1 to 221_M. The memory controller 210 may include an ECC engine 211. The semiconductor memory device 220 may output fail bits Fail [1:M] generated from the M DRAM chips 221_1 to 221_M to the memory controller 210 without performing a calculation operation for generating fail information.

Data DATA may be stored in M-1 DRAM chips among the M DRAM chips 221_1 to 221_M, and parity information Info_PAR may be stored in the remaining one DRAM chip. The semiconductor memory device 220 may include M ports for outputting data DATA or parity information Info_PAR read from any of the M DRAM chips 221_1 to 221_M to the memory controller 210, and each of the ports may include a plurality of pins. If any of the DRAM chips 221_1 to 221_M outputs data DATA or parity information Info_PAR on a 4-bit basis, each port may include four pins.

As described above, a DRAM chip, in which a larger detection code is stored, may be unnecessary to be provided with the semiconductor memory device 220, and thus, the semiconductor memory device 220 may further include a port corresponding to the removed DRAM chip. That is, the semiconductor memory device 220 may include (M+1) ports corresponding to the M DRAM chips 221_1 to 221_M. According to an embodiment, the fail bits Fail [1:M] may be provided to the memory controller 210 via an additional port corresponding to the removed DRAM chip. The memory controller 210 may determine the position of a failed DRAM chip based on the fail bits Fail [1:M] and recover data DATA of the failed DRAM chip by using the fail bits Fail [1:M] and the parity information Info_PAR.

Figure 4:
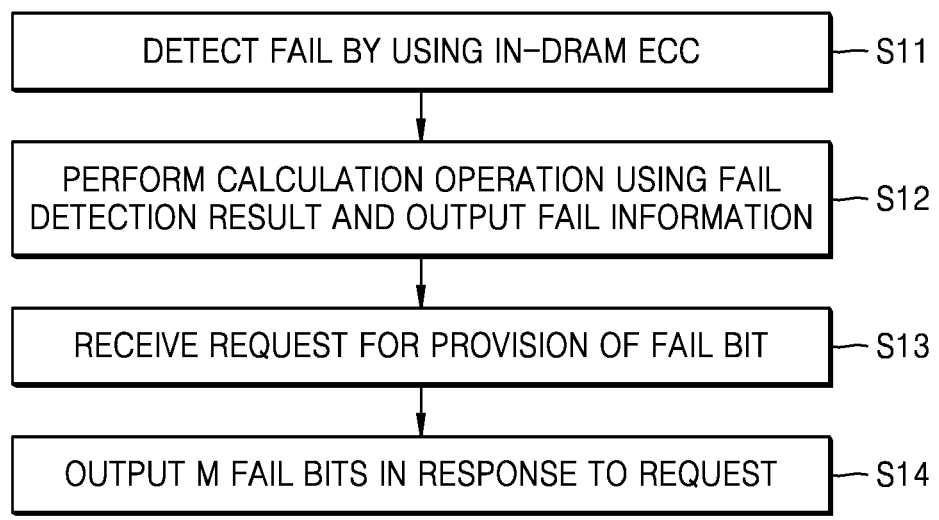
FIG. 4 is a flowchart illustrating a method of operating a semiconductor memory device, according to an exemplary embodiment of the inventive concept.

FIG. 4 is a flowchart illustrating a method of operating a semiconductor memory device, according to an exemplary embodiment of the inventive concept.

Referring to FIG. 4, the semiconductor memory device includes a plurality of DRAM chips, and an In-DRAM ECC is employed in each of the plurality of DRAM chips, so that fail detection using the In-DRAM ECC may be performed (Operation S11). As an example, during a read operation of multi-chip data DATA by an external source, such as by a memory controller, each of the DRAM chips may read a portion of the multi-chip data DATA and analyze the same to detect the existence of bit errors, correct any detected bit errors or determine that an uncorrectable error occurs within the read portion of the multi-chip DATA and thus determine that it should be considered a failed chip for this multi-chip data read operation. Error detection and correction may be performed by the In-DRAM ECC of each DRAM chip and be based on an error correction code associated with the portion of multi-chip data DATA stored within that DRAM chip (such error correction code being generated by the In-DRAM ECC upon analysis of the portion of the multi-chip data DATA upon writing the same within the DRAM chip). The error detection and correction performed by the In-DRAM ECC may be independent of the error correction performed on full multi-chip data DATA by the memory controller, however, error correction performed on the multi-chip data DATA by the memory controller may depend on the In-DRAM ECC analysis of the corresponding portion of the multi-chip data DATA (e.g., to identify what DRAM chip corresponds to, or to identify what range of bits of the multi-chip data DATA may include, the erroneous bits of the multi-chip data DATA). Each DRAM chip may generate a fail bit to indicate whether or not it should be considered a failed chip for this multi-chip data read operation or whether data provided by the DRAM chip is considered error free. Also, each of the M DRAM chips may generate a fail bit corresponding to one bit as a result of fail detection, and thus M fail bits corresponding may be generated by the semiconductor memory device as the semiconductor memory device includes M DRAM chips.

The semiconductor memory device may perform a calculation operation using the M fail bits and output fail information according to a calculation operation result to a memory controller (Operation S12). For example, 1-bit fail information may be generated by performing an XOR operation on M fail bits generated from the M DRAM chips. For example, a first logic state of the 1-bit fail information may indicate that at least one of the M DRAM chips is a failed chip for this multi-chip data read operation of DATA and a second logic state may indicate that none of the M DRAM chips were a failed chip for this multi-chip data read operation of DATA.

The memory controller may selectively perform a recovery operation for recovering data of a failed chip based on a logic state of the fail information. When the fail information corresponds to the first logic state, the semiconductor memory device may receive a request from the memory controller to provide fail bits to the memory controller (Operation S13). The previously generated M fail bits may be temporarily stored in a predetermined storage circuit (e.g., a register) in the semiconductor memory device, and the semiconductor memory device may output the M fail bits, stored in the storage device, to the memory controller in response to the request from the memory controller (Operation S14) to allow the memory controller to identify which of the M DRAM chips is a failed chip for this multi-chip data read operation of DATA.

Figure 5:
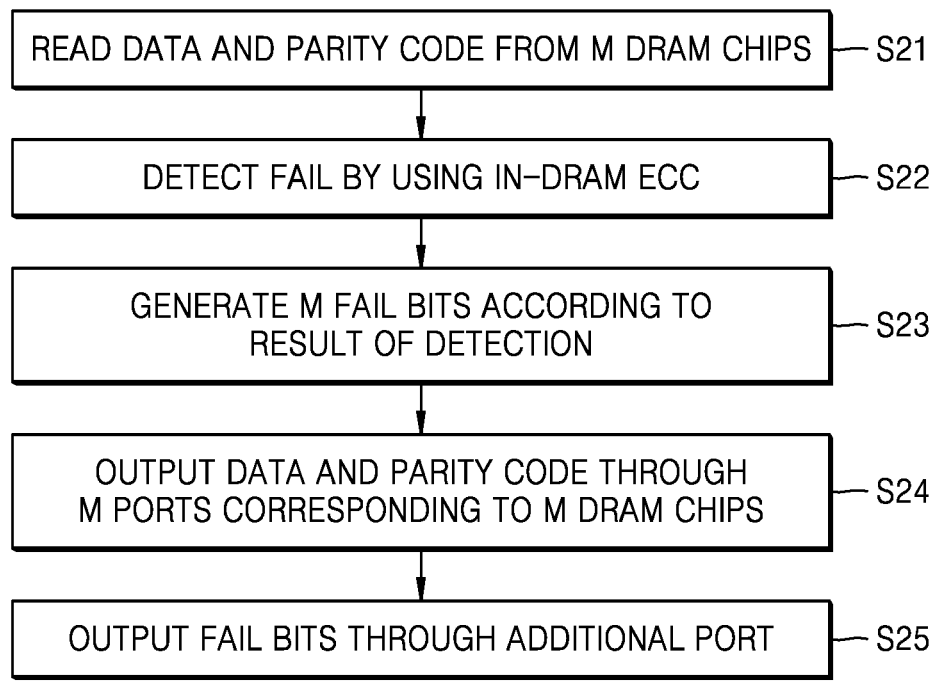
FIG. 5 is a flowchart illustrating a method of operating a semiconductor memory device, according to another exemplary embodiment of the inventive concept.

FIG. 5 is a flowchart illustrating a method of operating a semiconductor memory device, according to another exemplary embodiment of the inventive concept. In the embodiment of FIG. 5, it is assumed that the semiconductor memory device includes M DRAM chips, data or parity information from each of the DRAM chips is output through one port, and the semiconductor memory device includes (M+1) ports corresponding to the M DRAM chips. In addition, it is assumed that parity information does not include a detection code that is sufficient by itself to identify an erroneous bit of a predetermined unit of data, according to an embodiment of the inventive concept.

Referring to FIG. 5, the semiconductor memory device may store data and a parity code that is used to recover data of a failed chip. As an example, the data may be stored in (M−1) DRAM chips and the parity code may be stored in the remaining one DRAM chip. In response to a read request from a memory controller, the data and the parity code may be read out from the M DRAM chips of the semiconductor memory device (Operation S21).

In the process of reading the data and the parity code, a fail may be detected depending on whether or not an uncorrectable error occurs for each DRAM chip, by using an In-DRAM ECC provided in each of the M DRAM chips (Operation S22). In addition, one fail bit may be generated in each DRAM chip according to a result of detection of a fail occurrence, and thus, M fail bits may be generated in the semiconductor memory device (Operation S23).

The data, the parity code and the generated fail bit may be output through the (M+1) ports. As an example, the data, the parity code and the fail bit may be outputted in parallel through the (M+1) ports. For example, data and a parity code from the M DRAM chips provided in the semiconductor memory device may be output through corresponding M ports (Operation S24). On the other hand, the semiconductor memory device may include an additional port that does not correspond to the M DRAM chips, and the fail bit may be output through the additional port among the (M+1) ports (Operation S25). For example, each of the (M+1) ports may include the same number of pins, and when one DRAM chip for storing a detection code is removed from the semiconductor memory device, the additional port may be a port corresponding to the DRAM chip removed from the semiconductor memory device.

Figure 6:
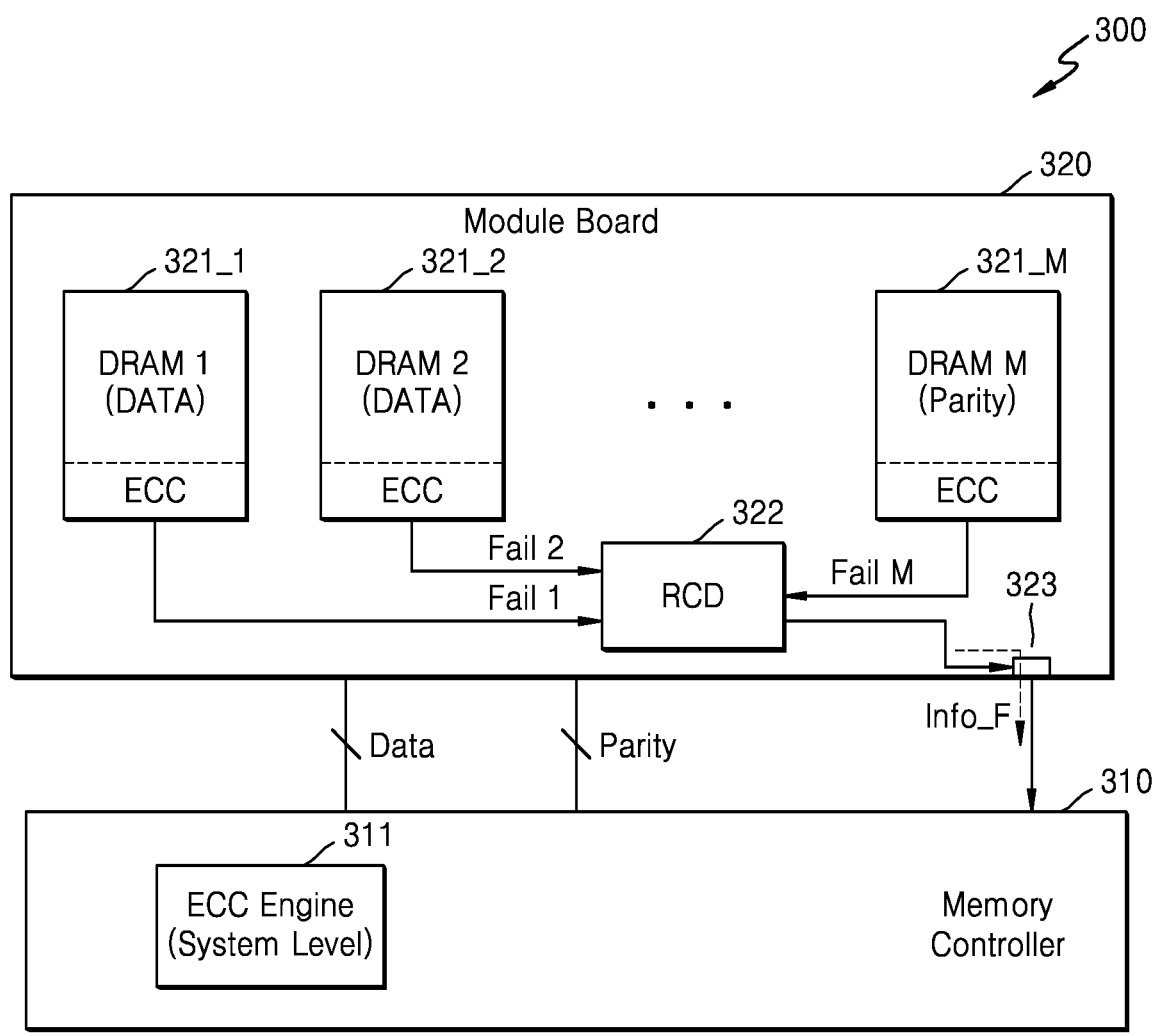
FIG. 6 is a block diagram illustrating a specific implementation of a memory system according to an exemplary embodiment of the inventive concept.

FIG. 6 is a block diagram illustrating a specific implementation of a memory system 300 according to an exemplary embodiment of the inventive concept.

Referring to FIG. 6, the memory system 300 may include a memory controller 310 and a semiconductor memory device, and the semiconductor memory device may include a memory module 320 in which the M DRAM chips 321_1 to 321_M are mounted on a module board. The memory controller 310 may include an ECC engine 311. The memory module 320 may further include a register clock driver (RCD) 322 mounted on the module board that receives a command and an address from the memory controller 310 and that delivers the command and the address to the M DRAM chips 321_1 to 321_M. According to an embodiment, the RCD 322 may be implemented as a separate semiconductor chip and mounted on the module board. In addition, the semiconductor chip in which the RCD 322 is implemented may be referred to as a buffer chip in that the buffer chip temporarily stores a command, an address, and/or fail bits Fail 1 to Fail M.

The memory module 320 may be implemented as various types of modules. As an example, the memory module 320 may correspond to a dual in-line memory module (DIMM)

that is typically used in a server. In addition, the memory module 320 may correspond to various types of DIMMs, and for example, various types of DIMMs such as an FB-DIMM and an LR-DIMM may be applied to the memory module 320. Alternatively, the memory module 320 may correspond to a non-volatile DIMM (NVDIMM) mounted with a non-volatile memory (e.g., a flash memory (not shown)) to compensate for the problem of a volatile memory in which data is lost when power is turned off. However, embodiments of the inventive concept are not limited thereto and the memory module 320 may be implemented by various memory modules such as a single in-line memory module (SIMM), a small-outline DIMM (SO-DIMM), an unbuffered DIMM (UDIMM), a rank-buffered DIMM (RB-DIMM), a min-DIMM, and a micro-DIMM.

As shown in FIG. 6, the memory controller 310 may generate parity information based on data DATA and provide the data DATA and the parity information to the memory module 320. In the present embodiment, as a detection code associated with DATA to determine a location of a failed chip is not stored in the memory module 320, only a parity code Parity may be selectively provided to the memory module 320 as the parity information. The parity code Parity may be insufficient by itself to determine the location of an erroneous bit within DATA (during a subsequent read operation), and thus insufficient to correct by itself DATA having an erroneous bit. The memory controller 310 may include M input/output ports (not shown) corresponding to the M DRAM chips 321_1 to 321_M. Data DATA and a parity code Parity may be stored in the M DRAM chips 321_1 to 321_M, and the parity code Parity may be used as information for recovering a fail in chip units, occurred in (M−1) DRAM chips 321_1 to 321_M−1 storing the data DATA.

Each of the M DRAM chips 321_1 to 321_M may include an In-DRAM ECC (ECC), and the In-DRAM ECC may generate a fail bit indicating whether or not an uncorrectable error has occurred in a portion of the data DATA or within parity code Parity stored within and read from a corresponding DRAM chip. As an example, fail bits Fail 1 to Fail M may be generated from the M DRAM chips 321_1 to 321_M and may be provided to the RCD 322 through an interconnection line of the module board.

The RCD 322 may generate fail information Info_F by performing arithmetic processing on received fail bits Fail 1 to Fail M. According to an embodiment, the fail information Info_F may be provided to the memory controller 310 through a separate terminal 323 corresponding to a report pin formed on the module board. Also, as an example, the separate terminal 323 may include one pin for outputting one bit, and the RCD 322 may generate one bit of fail information Info_F based on the fail bits Fail 1 to Fail M and provide the one bit of fail information Info_F to the memory controller 310 through the separate terminal 323. According to an embodiment, when the memory module 320 corresponds to an NVDIMM, an error report pin defined in relation to the operation of a non-volatile memory in the memory module 320 of the NVDIMNM type may be used as the separate terminal 323 for outputting the fail information Info_F.

As described above, the memory controller 310 may receive the fail information Info_F and perform an error correction operation and/or a data recovery operation based on the received fail information Info_F. As an example, it may be determined whether a fail in chip units has occurred according to a logic state of the fail information Info_F. When a fail in chip units has not occurred, the ECC engine 311 may perform a general error correction operation using a parity code Parity. On the other hand, when a fail in chip units has occurred, the ECC engine 311 may perform a data recovery operation based on a system level error correction.

Figure 7:
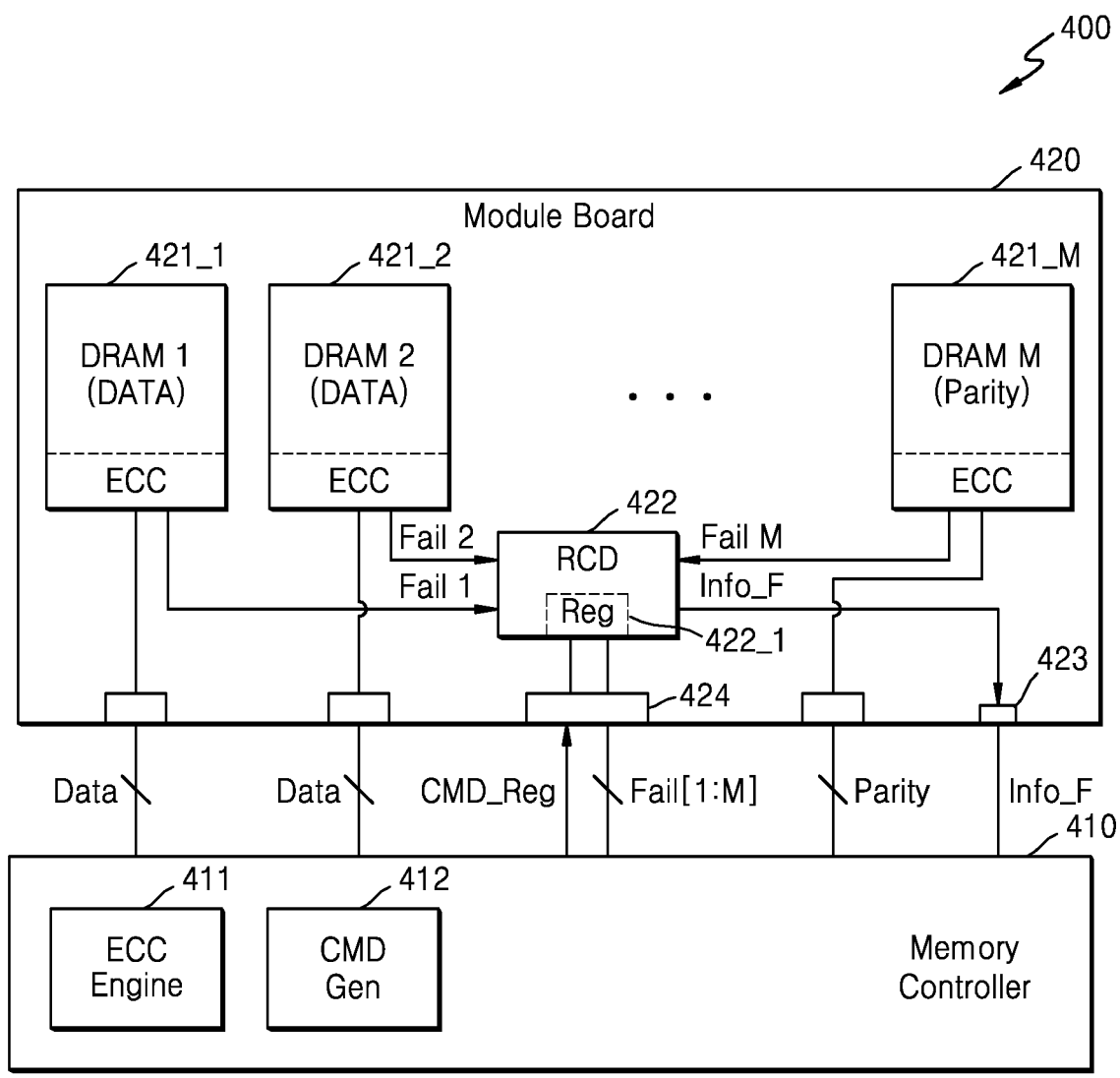
FIGS. 7 and 8 are block diagrams illustrating specific implementations of a memory system according to another exemplary embodiment of the inventive concept.
Figure 8:
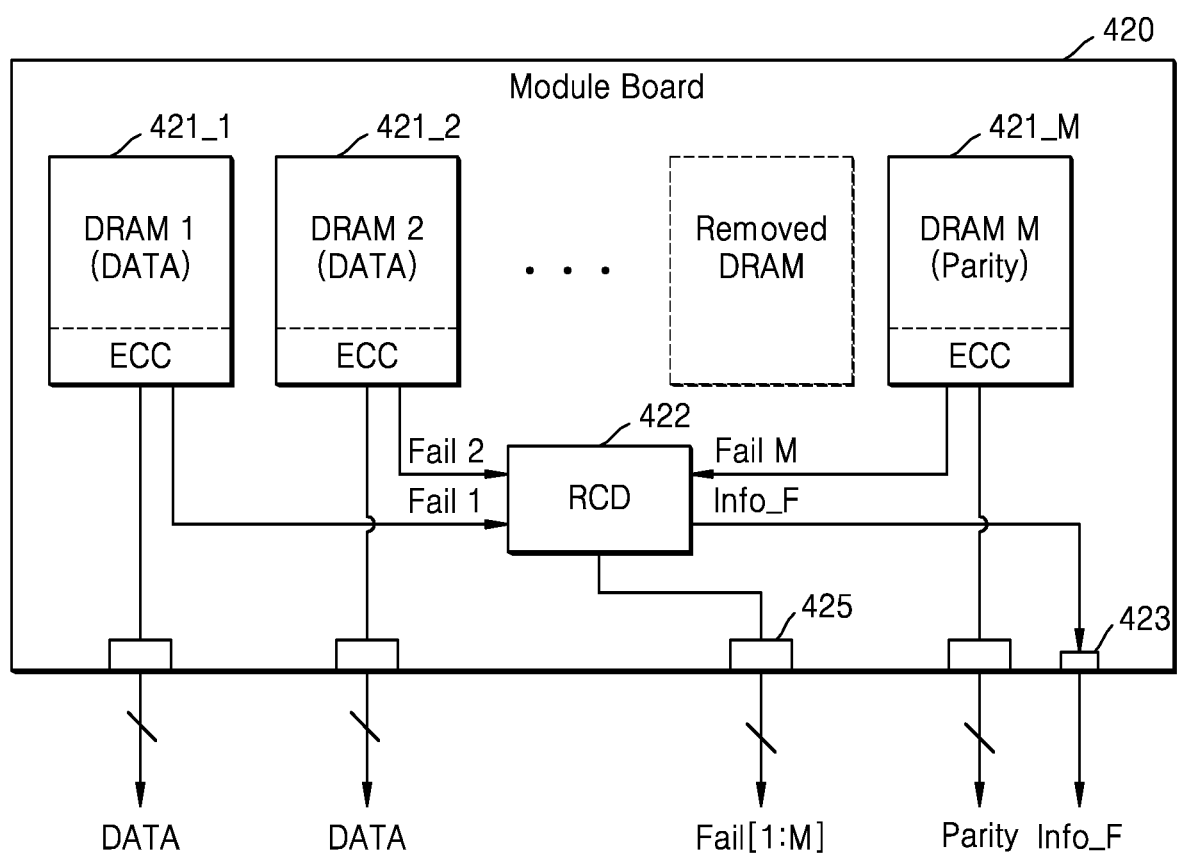

FIGS. 7 and 8 are block diagrams illustrating specific implementations of a memory system 400 according to another exemplary embodiment of the inventive concept.

Referring to FIG. 7, the memory system 400 may include a memory controller 410 and a memory module 420, and M DRAM chips 421_1 to 421_M may be mounted on a module board of the memory module 420. The memory controller 410 may include an ECC engine 411 and a command generator 412. In addition, the memory module 420 may further include an RCD 422, and the RCD 422 may include a register 422_1.

The RCD 422 may receive fail bits Fail 1 to Fail M from the M DRAM chips 421_1 to 421_M and generate fail information Info_F through a calculation operation using the fail bits Fail 1 to Fail M, and the fail information Info_F may be provided to the memory controller 410 through an additional terminal 423 corresponding to a report pin formed on the module board.

The memory controller 410 may perform an error correction operation based on the received fail information Info_F. If it is determined that there is no failed chip as the fail information Info_F corresponds to a second logic state, the ECC engine 411 may perform a general error correction operation using a parity code Parity. On the other hand, if it is determined that there is at least one failed chip as the fail information Info_F corresponds to a first logic state, the command generator 412 may generate a register access command CMD_Reg for accessing the register 422_1 in the RCD 422 and provide the register access command CMD_Reg to the memory module 420. In addition, fail bits Fail 1 to Fail M read from the register 422_1 may be provided to the memory controller 410.

The memory module 420 may include M ports corresponding to the M DRAM chips 421_1 to 421_M and may further include a port 424 for transmitting and receiving signals between the RCD 422 and the memory controller 410. The port 424 may include a plurality of pins, the register access command CMD_Reg described above may be provided to the RCD 422 through the port 424, and fail bits Fail 1 to Fail M from the RCD 422 may be provided to the memory controller 410 through the port 424.

The ECC engine 411 may determine the position of a failed chip based on received fail bits Fail 1 to Fail M and may recover data DATA of the failed chip through a recovery operation based on a system level error correction using the fail bits Fail 1 to Fail M and a parity code Parity.

FIG. 8 illustrates an example in which a path through which fail bits Fail [1:M] are transmitted is modified from the embodiment described above.

Referring to FIG. 8, an example in which a DRAM chip storing a detection code for data recovery in chip units is removed from a memory module is illustrated. That is, a DRAM chip (for example, a detection code chip), in which a detection code indicating the position of a failed chip is stored, is unnecessary and not provided with the module board, and one port 425 corresponding to the removed DRAM chip storing the detection code may be used as a port for transmitting the fail bits Fail [1:M] described above. Accordingly, interconnection lines for electrical connection between the RCD 422 and a plurality of pins included in the port 425 may be formed on the module board.

According to the embodiment of FIG. 8, since a DRAM chip storing a detection code for recovering data of a failed chip is unnecessary, manufacturing cost of the memory module may be reduced. In addition, since a separate port for providing the fail bits Fail [1:M] including a plurality of bits to the memory controller does not need to be formed on the module board, the number of ports formed on the module board may be reduced.

Figure 9:
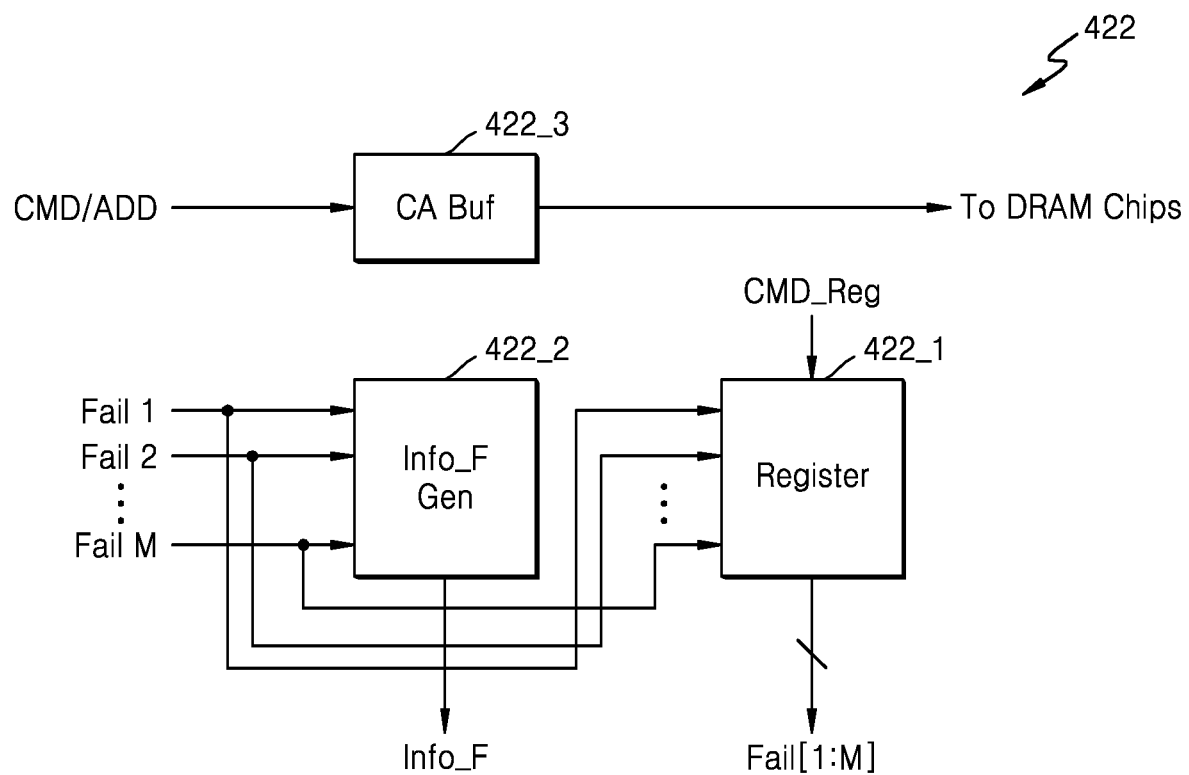
FIG. 9 is a block diagram illustrating an embodiment of a register clock driver (RCD) shown in FIG. 7.

FIG. 9 is a block diagram illustrating an embodiment of the RCD 422 shown in FIG. 7.

Referring to FIGS. 7 and 9, the RCD 422 may include a register 422_1, a fail information generator 422_2, and a command/address buffer 422_3. The command/address buffer 422_3 may receive and store a command CMD and an address ADD, provided from the memory controller 410, and may provide the stored command CMD and address ADD to the M DRAM chips 421_1 to 421_M.

Fail bits Fail 1 to Fail M generated from the M DRAM chips 421_1 to 421_M may be provided to the register 422_1 and the fail information generator 422_2. The fail information generator 422_2 may generate fail information Info_F through a calculation operation using an XOR operation or other various methods. In addition, the register 422_1 may output M fail bits Fail [1:M], stored therein, in response to the register access command CMD_Reg from the memory controller 410 or a result obtained by decoding the register access command CMD_Reg.

Figure 10:
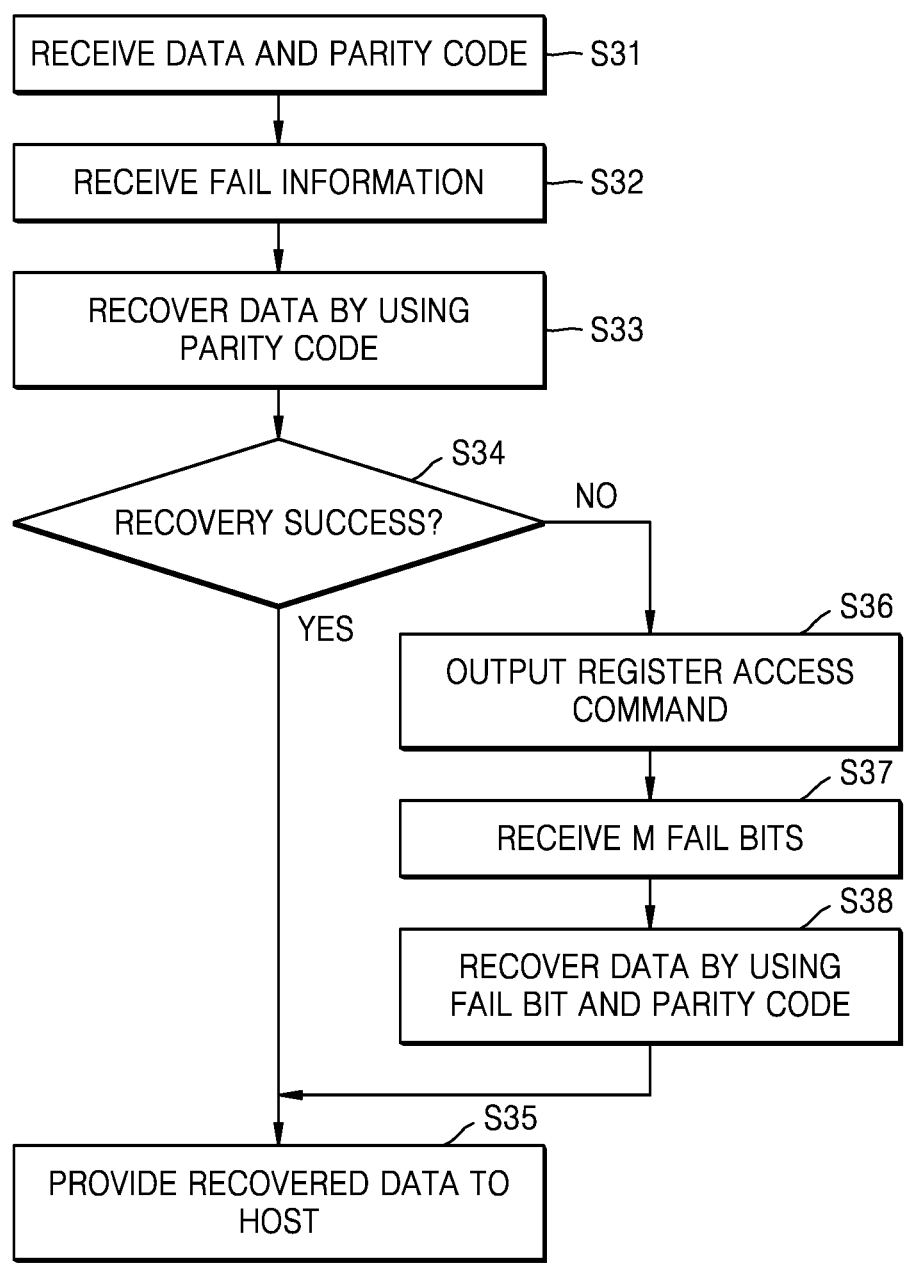
FIG. 10 is a flowchart illustrating an error correction process in a memory controller, according to an exemplary embodiment.

FIG. 10 is a flowchart illustrating an error correction process in a memory controller, according to an exemplary embodiment.

Referring to FIG. 10, the memory controller may generate a parity code corresponding to a predetermined unit of data and write the parity code to a memory module including a plurality of DRAM chips. A parity code may be generated corresponding to a predetermined number of bits of data. For example, a 4-bit parity code may be generated corresponding to 32-bit or 64-bit data.

Also, the memory controller may provide a command (a read command) and address to the memory module to read data that is stored within multiple memory chips of the memory module at a location within the memory module identified by the address and a parity code corresponding to the read data stored within at least one additional memory chip of the memory module, and the memory controller may receive the read data and the parity code (Operation S31). Also, according to the embodiments described above, a fail bit may be generated based on a chip level error detection result in each of the DRAM chips in the memory module, fail information may be generated through a calculation operation using the fail bit, and the memory controller may receive the fail information (Operation S32).

The memory controller may include an ECC engine for performing a system level error correction and may selectively perform a recovery operation for recovering a fail in chip units according to the received fail information. For example, if it is determined that at least one DRAM chip failed according to the fail information, an operation of recovering data of a failed DRAM chip may be performed using the received parity code (Operation S33).

It is determined whether or not the data has been successfully recovered by the data recovery operation (Operation S34). If it is determined that the data has been successfully recovered, recovered data may be provided to a host (Operation S35). On the other hand, if it is determined that the data has not been successfully recovered, the memory controller may generate a register access command to read a fail bit stored in the memory module and may output the register access command to the memory module (Operation S36).

According to an embodiment, the memory controller may receive M fail bits corresponding to M memory chips (Operation S37) and may perform a data recovery operation using the received fail bits and parity code (Operation S38). The data recovery operation corresponds to a recovery operation in a state in which the position of (or identity of) a failed DRAM chip has been determined based on the fail bits, and thus, the probability of recovering data of the failed DRAM chip increases. If the data of the failed DRAM chip is normally recovered according to the above procedure, the recovered data may be provided to the host (Operation S35).

Figure 11:
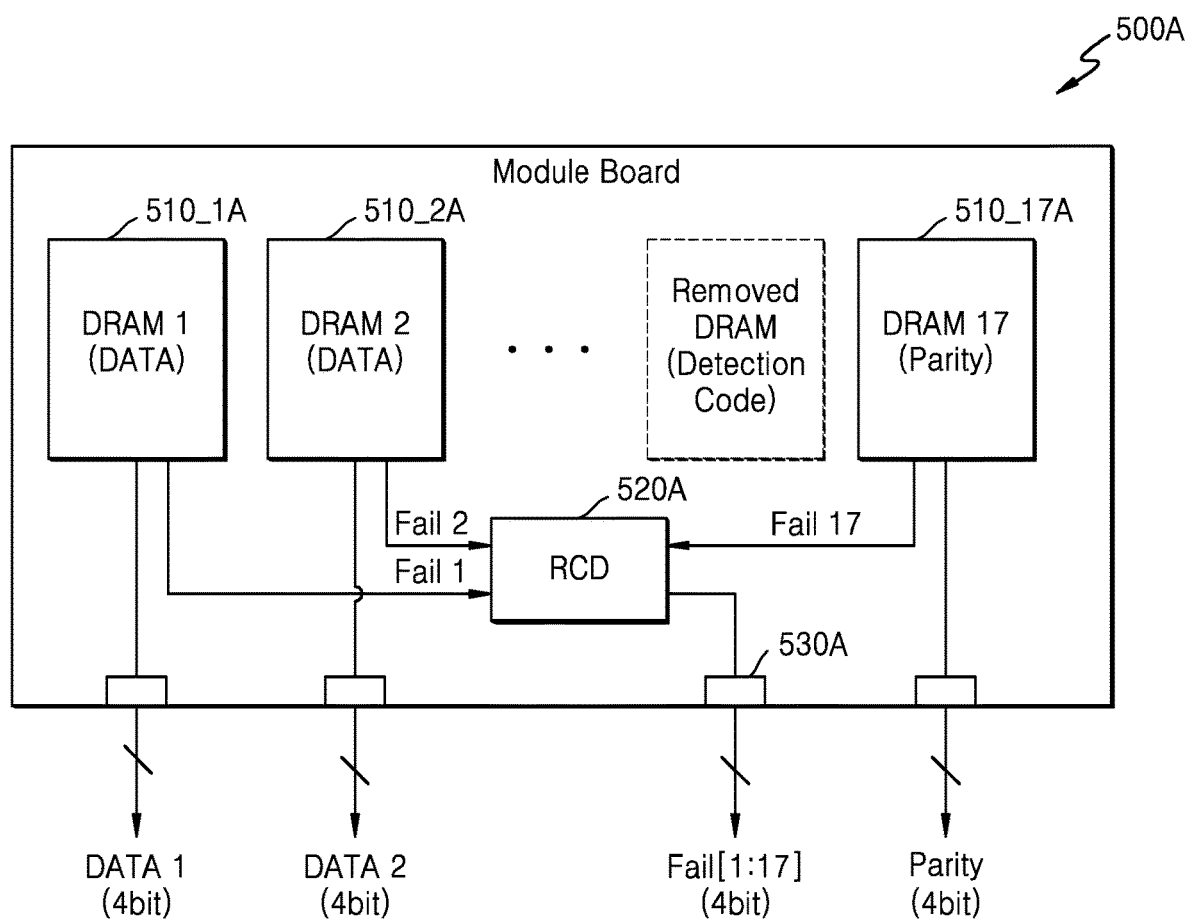
FIG. 11 is a block diagram illustrating an implementation of a memory module according to an exemplary embodiment of the inventive concept.

FIG. 11 is a block diagram illustrating an implementation of a memory module 500A according to an exemplary embodiment of the inventive concept.

FIG. 11 shows an example in which parity information is generated corresponding to 64-bit data DATA as defined in the DDR4specification. In addition, according to an embodiment, parity information stored in the memory module 500A may only include a 4-bit parity code Parity excluding a detection code. Accordingly, first to seventeenth DRAM chips 510_1A to 510_17A may be mounted on a module board of the memory module 500A, and each of the first to seventeenth DRAM chips 510_1A to 510_17A may output 4-bit (X4) data DATA or a 4-bit parity code Parity. The first to sixteenth DRAM chips 510_1A to 510_16A may store data DATA and the seventeenth DRAM chip 510_17A may store the parity code Parity.

According to the embodiments described above, since a detection code for indicating the position of (or identity of) a DRAM chip in which a fail in chip units has occurred is not generated by a memory controller or is not stored in the memory module 500A, a DRAM chip for storing the detection code may be removed from the memory module 500A. In addition, 64-bit data DATA and a corresponding 4-bit parity code may be read from the first to seventeenth DRAM chips 510_1A to 510_17A, and fail bits Fail[1:17] of the first to seventeenth DRAM chips 510_1A to 510_17A may be provided from an RCD 520A to a memory controller (not shown). Although not shown in FIG. 11, fail information generated by calculating the fail bits Fail [1:17] may be first provided to the memory controller before the fail bits Fail [1:17] are provided to the memory controller.

A port 530A shown in FIG. 11 may be a port corresponding to a DRAM chip for storing a detection code, removed from the module board (or not mounted on the module board), and the port 530A may include the same number of pins as a port for outputting the data DATA or the parity code Parity. As an example, the fail bits Fail [1:17] including 17 bits may be provided to the memory controller through the port 530A sequentially by four bits.

Figure 12:
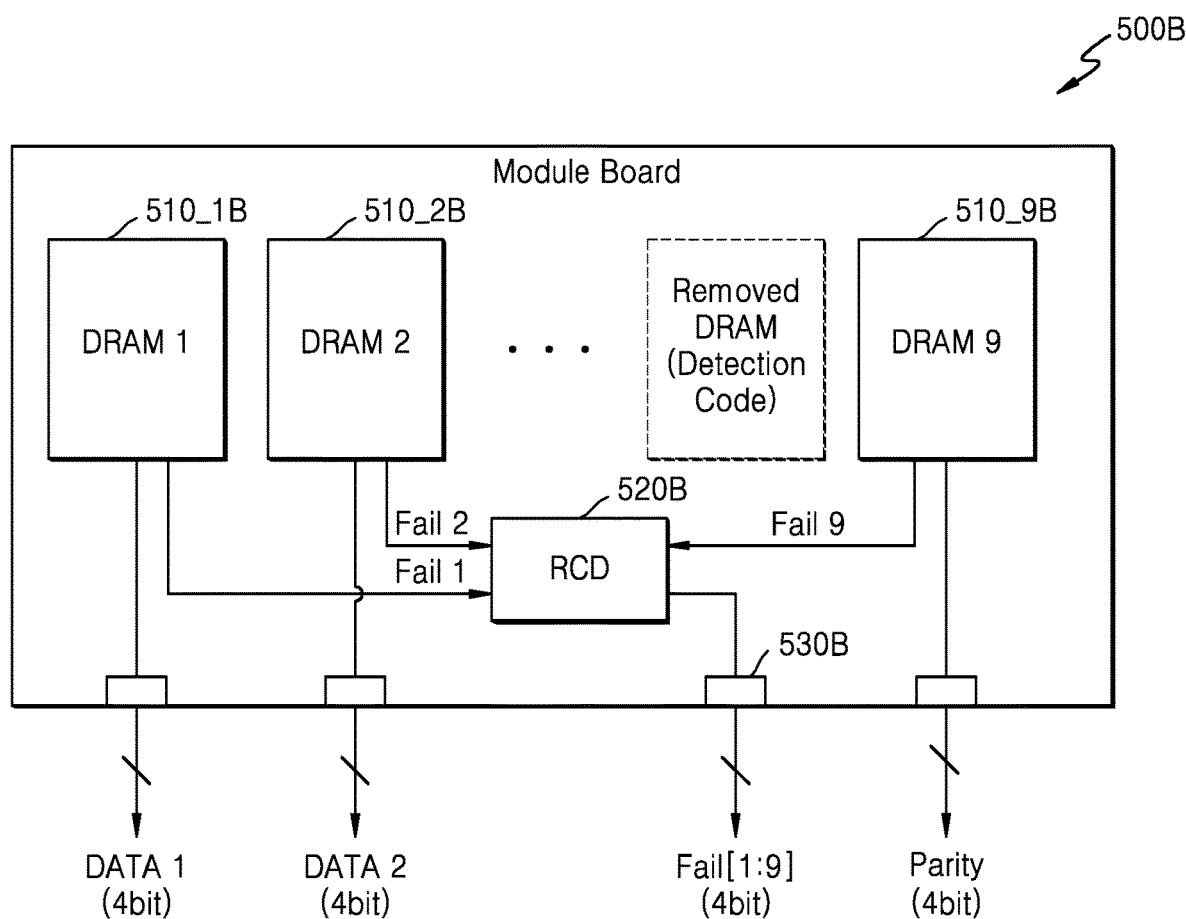
FIG. 12 is a block diagram illustrating an implementation of a memory module according to another exemplary embodiment of an inventive concept.

FIG. 12 is a block diagram illustrating an implementation of a memory module 500B according to another exemplary embodiment of an inventive concept. FIG. 12 shows an example in which parity information is generated corresponding to 32-bit data DATA as defined in the specification DDR5. In addition, according to an embodiment, parity information stored in the memory module 500B may only include a 4-bit parity code excluding a detection code.

First to ninth DRAM chips 510_1B to 510_9B may be mounted on a module board of the memory module 500B, and each of the first to ninth DRAM chips 510_1B to 510_9B may output 4-bit (X4) data DATA or a 4-bit parity code Parity. The first to eighth DRAM chips 510_1B to 510_8B may store data DATA and the ninth DRAM chip 510_9B may store the parity code Parity. In addition, a port 530B corresponding to a DRAM chip for storing a detection code, removed from the module board (or not mounted on the module board) may be disposed on the module board, fail bits Fail [1:9] including nine bits generated from the first to ninth DRAM chips 510_1B to 510_9B may be stored in an RCD 520B, and the RCD 520B may sequentially provide the fail bits Fail [1:9] by four bits to a memory controller through the port 530B.

Figure 13:
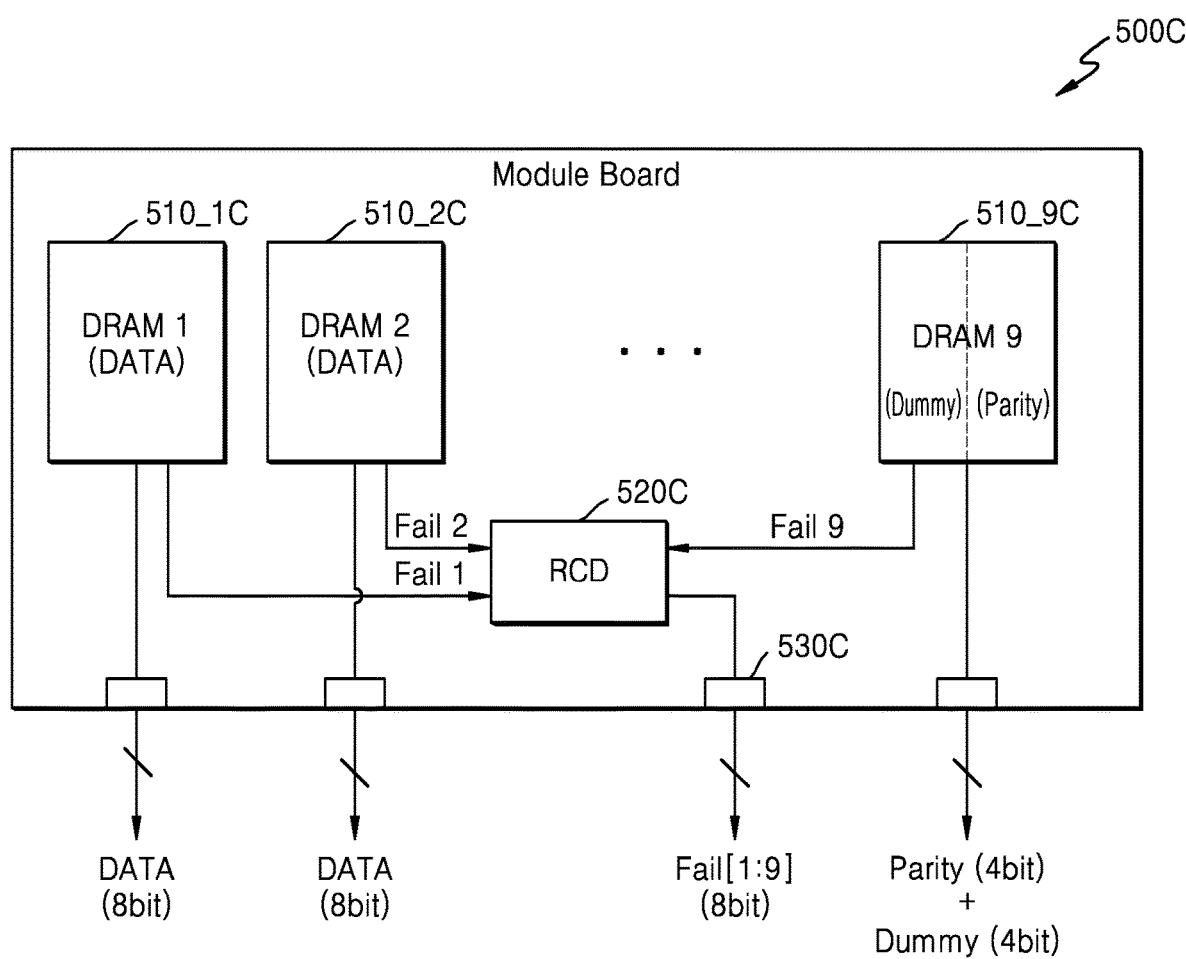
FIG. 13 is a block diagram illustrating an implementation of a memory module according to another exemplary embodiment of an inventive concept.

FIG. 13 is a block diagram illustrating an implementation of a memory module 500C according to another exemplary embodiment of the inventive concept. FIG. 13 shows an example in which parity information is generated corresponding to 64-bit data DATA. According to an embodiment, parity information stored in the memory module 500C may only include a 4-bit parity code Parity excluding a detection code. First to ninth DRAM chips 510_1C to 510_9C may be mounted on a module board of the memory module 500C, and each of the first to ninth DRAM chips 510_1C to 510_9C may output 8-bit (X8) information. The first to eighth DRAM chips 510_1C to 510_8C may store data DATA and the ninth DRAM chip 510_9C may store the parity code Parity.

As each of the first to ninth DRAM chips 510_1C to 510_9C inputs or outputs information in 8-bit units thereto or therefrom, each of the first to eighth DRAM chips 510_1C to 510_8C may store or output data DATA in 8 bit units. On the other hand, according to an embodiment of the inventive concept, the parity information may only include a parity code corresponding to 4 bits, and accordingly, in an 8-bit write operation for the ninth DRAM chip 510_9C, a parity code corresponding to 4 bits and dummy data Dummy corresponding to 4 bits may be written in the ninth DRAM chip 510_9C. The dummy data Dummy is arbitrary data irrelevant to the data DATA or the parity code Parity. For example, the dummy data Dummy may be data of which all bits are "0" or "1".

Although the present embodiment illustrates a case where 4-bit dummy data Dummy is written in the ninth DRAM chip 510_9C as information is input or output in 8-bit units to or from each of the first to ninth DRAM chips 510_1C to 510_9C, embodiments of the inventive concept are not limited thereto. As an example, only a 4-bit parity code may be stored in the ninth DRAM chip 510_9C without generating the dummy data Dummy. Alternatively, in the ninth DRAM chip 510_9C, additional code information (for example, a correction code for correcting a random error or a multi-bit error) for improving error correction capability may be further stored with the 4-bit parity code Parity.

When the detection code is used, the detection code may be stored in the ninth DRAM chip 510_9C together with a parity code Parity, while in the embodiment of FIG. 13 the detection code is not stored in the ninth DRAM chip 510_9C. That is, in the embodiment of FIG. 13, even though the detection code is not stored in the ninth DRAM chip 510_9C, the ninth DRAM chip 510_9C is not removed from the module board, and accordingly, there is no separate DRAM chip removed from the module board.

According to an embodiment, fail bits Fail [1:9] including nine bits generated from the first to ninth DRAM chips 510_1C to 510_9C may be stored in an RCD 520C, and the RCD 520C may provide the fail bits Fail [1:9] to a memory controller through an additional port 530C formed in the module board. For example, the module board may be further provided with nine ports (not shown) corresponding to the first to ninth DRAM chips 510_1C to 510_9C and the additional port 530C corresponding to the RCD 520C, and the RCD 520C may sequentially provide the fail bits Fail [1:9] by eight bits to the memory controller through the additional port 530C. As an alternative embodiment, the additional port 530C may include a different number of pins than a port that outputs the data DATA or the parity code Parity, and for example, the fail bits Fail [1:9] may be sequentially output by 4 bits through the additional port 530C.

In addition, the memory controller may perform an error correction operation (or an operation of recovering data of a failed DRAM chip) using 64-bit data DATA and a 4-bit parity code read from the first to ninth DRAM chips 510_1C to 510_9C and. In this case, the dummy data Dummy may not be read or may not be used by the memory controller even if the dummy data Dummy is read.

Figure 14:
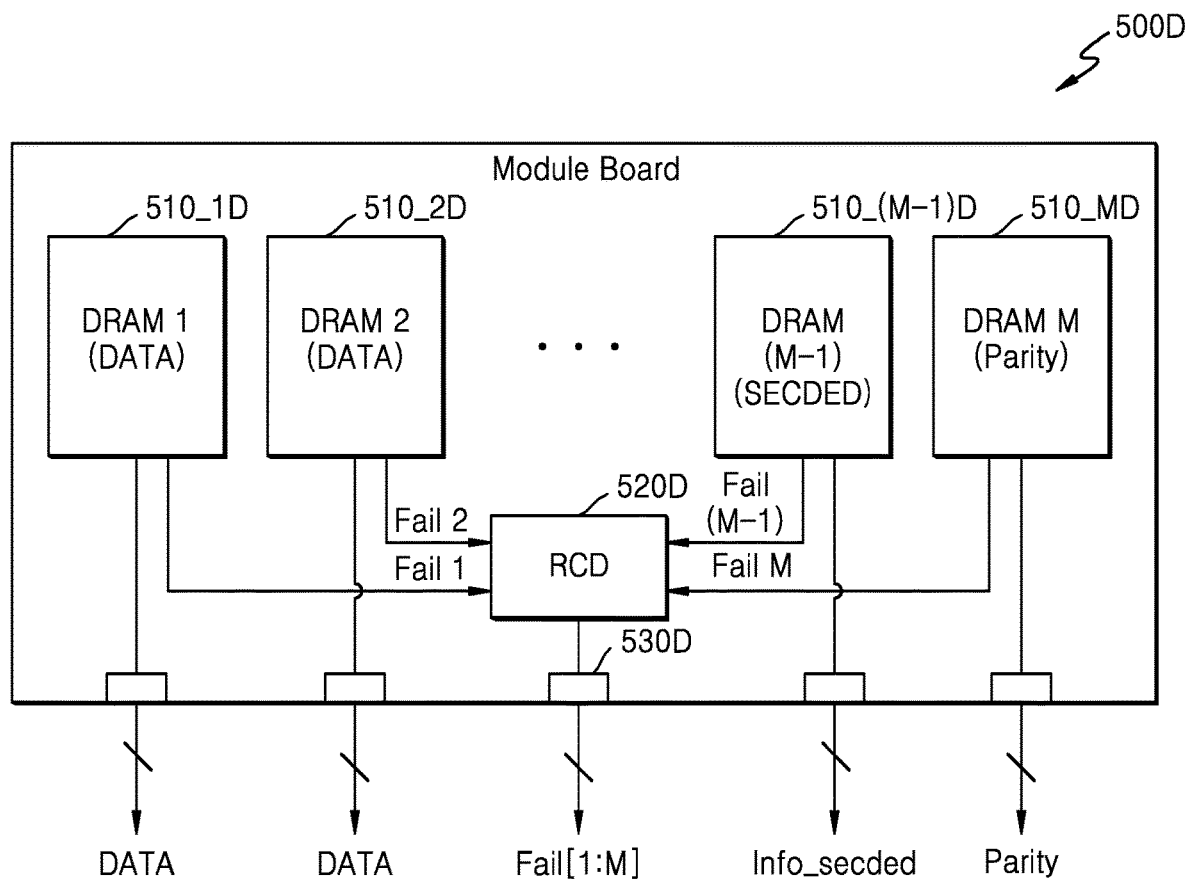
FIG. 14 is a block diagram illustrating an implementation of a memory module according to another exemplary embodiment of an inventive concept.

FIG. 14 is a block diagram illustrating an implementation of a memory module 500D according to another exemplary embodiment of an inventive concept. FIG. 14 shows an example in which a DRAM chip for storing a detection code is not removed from a module board. The specific number of bits is not shown in FIG. 14. However, in a manner that is substantially the same as that in the embodiments described above, parity information may be generated corresponding to 64-bit data or may be generated corresponding to 32-bit data.

Referring to FIG. 14, M DRAM chips 510_1D to 510_MD may be mounted on a module board of the memory module 500D, and each of the M DRAM chips 510_1D to 510_MD may output information including a plurality of bits. For example, as described above, each of the M DRAM chips 510_1D to 510_MD may output information in units of 4 bits (X4) or 8 bits (X8). In the present embodiment, it is assumed that each of the M DRAM chips 510_1D to 510_MD outputs information in units of 4 bits (X4).

Each of the first to (M–2)th DRAM chips 510_1D to 510_(M–2)D may store and output data DATA. The Mth DRAM chip 510_MD may store and output a parity code Parity. The (M–1)th DRAM chip 510 (M–1)D used for storing the detection code may store code information Info_secded for improving error detection and correction capability.

An RCD 520D may output fail bits Fail [1:M], provided from the M DRAM chips 510_1D to 510_MD, through a port 530D corresponding to the RCD 520D. An ECC engine (not shown) of a memory controller may recover data DATA of a failed DRAM chip by using the fail bits Fail [1:M] and the parity code Parity. The ECC engine of the memory controller may perform an error detection and correction operation by using the code information Info_secded read from the (M–1)th DRAM chip 510_(M–1)D, in addition to the recovery of data of the failed DRAM chip. For example, the ECC engine of the memory controller may correct random errors or multi-bit errors by using the code information Info_secded.

According to an embodiment, the ECC engine of the memory controller may perform a single error correction/double error detection (SEC/DED) operation on data DATA, read from the first to (M–2)th DRAM chips 510_1D to 510_(M–2)D, by using the code information Info_secded. However, this is only an embodiment of the inventive concept, and the code information Info_secded may be used for error detection and correction according to various types of error detection and correction algorithms.

When a large amount of resources for storing parity information is used for storing a detection code, a general error correction may not be performed or only one bit error may be corrected, in addition to recovering data of a failed chip. On the other hand, according to the embodiment as described above, since code information that is used for error detection and correction may be stored in resources storing the detection code, error detection and correction capability may be improved.

In the embodiments described above, DRAM chips mounted on a module board have the unit of input/output corresponding to a data width of X4 or X8. However, embodiments of the inventive concept are not limited thereto and the DRAM chips may be modified to have the unit of input/output corresponding to a data width of X16 and the like.

Figure 15:
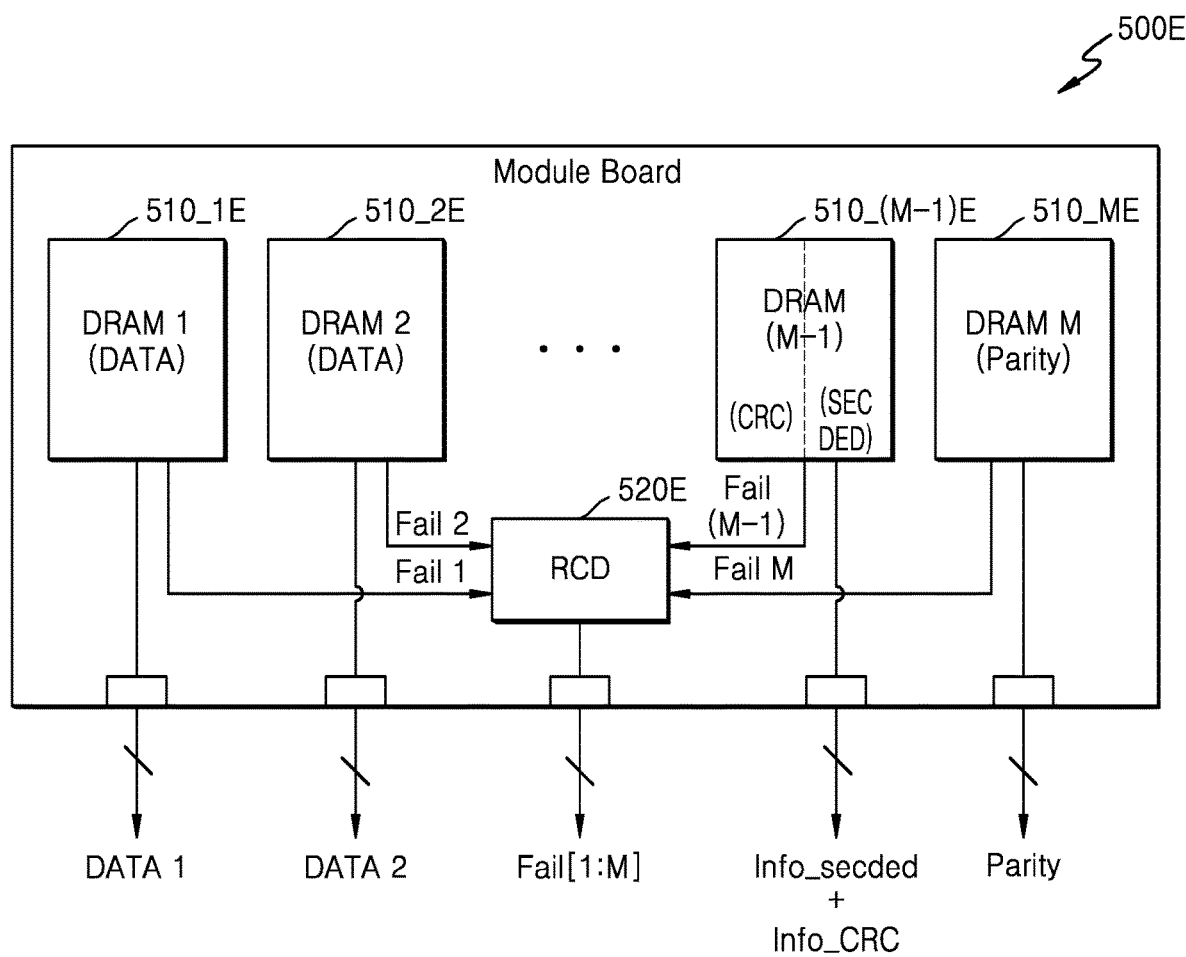
FIG. 15 is a block diagram illustrating an implementation of a memory module according to another exemplary embodiment of an inventive concept.

FIG. 15 is a block diagram illustrating an implementation of a memory module 500E according to another exemplary embodiment of an inventive concept. FIG. 15 shows an example in which a DRAM chip for storing a detection code is not removed from a module board as in the embodiment of FIG. 14 described above. In the embodiment of FIG. 15, each DRAM chip may input or output information as a unit having a plurality of bits and it is assumed that each DRAM chip outputs information in units of 4 bits (X4).

Referring to FIG. 15, M DRAM chips DRAM chips 510_1E to 510_ME may be mounted on a module board of the memory module 500E, and each of the M DRAM chips 510_1D to 510_MD may output information having a plurality of bits. As an example, each of the first to (M−2)th DRAM chips 510_1E to 510_(M−2)E may store or output data DATA. The Mth DRAM chip 510_ME may store and output a parity code Parity. The (M−1)th DRAM chip 510_(M−1)E used for storing a detection code may store a cyclic redundancy check (CRC) code, which is a detection code indicating the position of a failed chip, and code information Info_secded that is used for an additional error detection/correction operation. An RCD 520E may output fail bits Fail [1:M], provided from the M DRAM chips 510_1E to 510_ME, through a port 530E corresponding to the RCD 520E.

According to the embodiment shown in FIG. 15, since the position of a failed DRAM chip may be determined through the fail bits Fail [1:M], information (or the number of bits) about the CRC code as the detection code stored in the (M−1)th DRAM chip 510_(M−1)E of the memory module 500E may be minimized. Accordingly, a CRC code having the minimum number of bits (e.g., 1 or 2 bits) may be stored in the (M−1)th DRAM chip 510_(M−1)E, and code information Info_secded that may be used for an additional error detection/correction operation for improving error correction capability may be stored in other areas. That is, when there is a failed chip, a recovery operation may be performed using the fail bits Fail [1:M], the CRC code, and the parity code Parity, and an operation for detecting/correcting an error occurring in data DATA may be further performed using the code information Info_secded.

Figure 16:
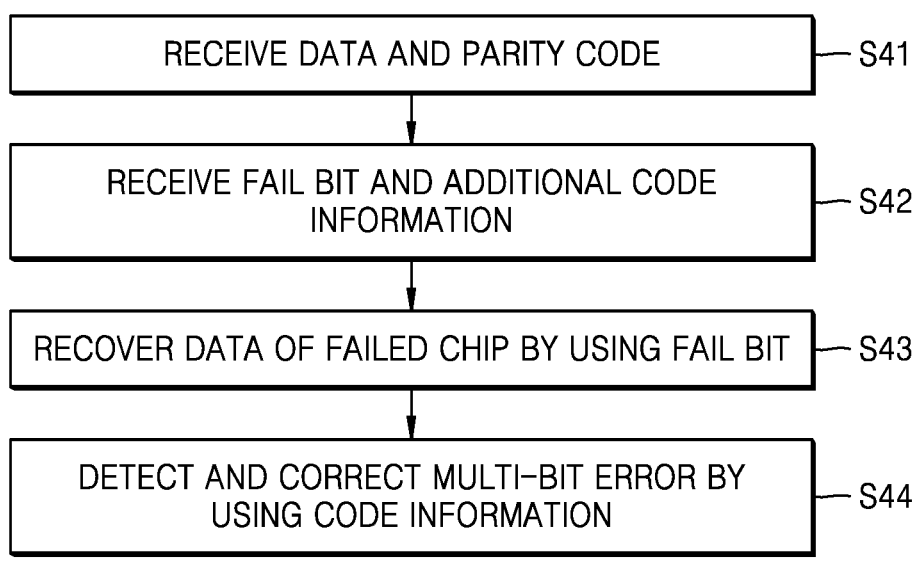
FIG. 16 is a flowchart illustrating a method of operating a memory controller, according to an embodiment of an inventive concept.

FIG. 16 is a flowchart illustrating a method of operating a memory controller, according to an embodiment of an inventive concept.

Referring to FIG. 16, the memory controller may receive data and a parity code from a semiconductor memory device (e.g., a memory module) including a plurality of DRAM chips (Operation S41). In addition, the memory controller may receive fail bits, which are used for data recovery of a failed chip, and may also receive code information that is used for an additional error detection/correction operation (e.g., a random error correction or multi-bit error correction operation) regardless of data recovery (Operation S42). Although not shown in FIG. 16, according to the embodiments described above, a memory controller may receive fail information generated by calculating fail bits having a plurality of bits, and when the fail information has a logic level indicating that at least one DRAM chip has failed, the memory controller may provide a command to the semiconductor memory device and receive the fail bits.

The memory controller may recover data of the failed chip by using the fail bits (Operation S43). For example, the memory controller may determine the position of a failed DRAM chip by referring to the fail bits, and may recover data of the failed DRAM chip data through a recovery operation using the received parity code. When the recovery operation is completed, an operation for detecting and correcting errors occurring in the plurality of DRAM chips may be further performed, and for example, an error may be detected and corrected using the received code information (Operation S44).

Figure 17:
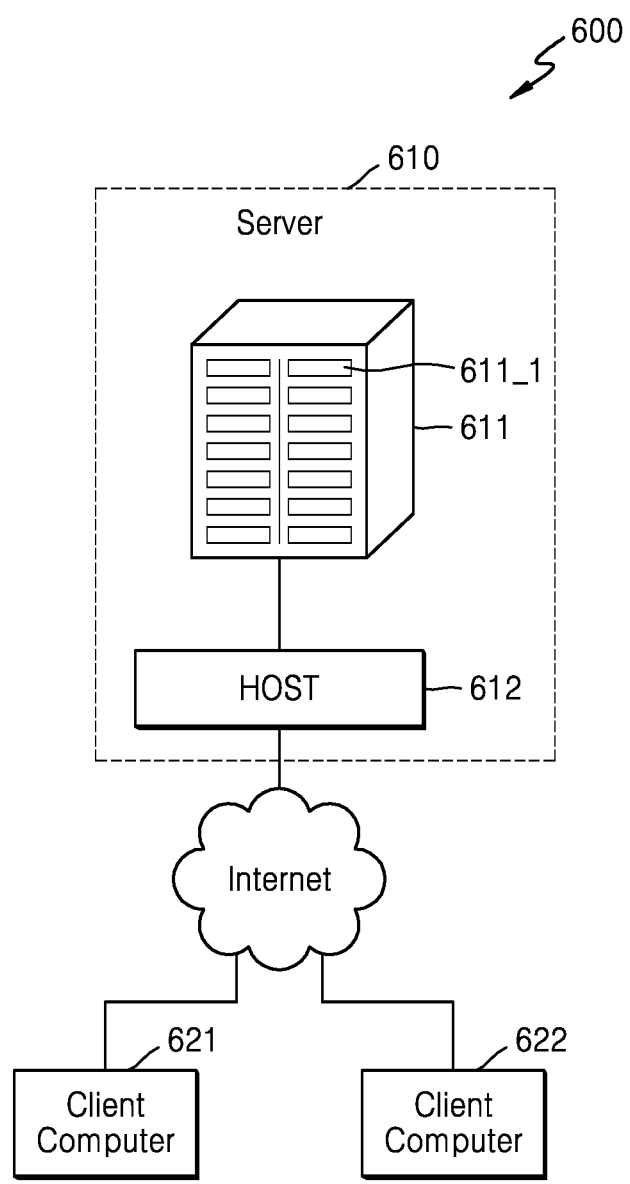
FIG. 17 is a block diagram of a data processing system according to an embodiment of the inventive concept.

FIG. 17 is a block diagram of a data processing system 600 according to an embodiment of the inventive concept. The data processing system 600 may include a data server 610 and one or more client computers 621 and 622. The data server 610 and the one or more client computers 621 and 622 may be interconnected via various networks such as the Internet and Wi-Fi. The data server 610 may correspond to a data center, an Internet data center, a cloud data center, or the like.

The data server 610 may include a database 611 and a host 612. The database 611 may include a semiconductor memory device according to the embodiments described above. As an example, the database 611 may include a plurality of DRAM modules 611_1 according to the embodiments described above. That is, a semiconductor memory device and a memory controller in the embodiments described above may be used in a server system. The host 612 may store data in the database 611 and may read data from the database 611 and provide it to the client computers 621 and 622.

The host 612 may include a memory controller according to the embodiments described above. Accordingly, the host 612 may generate parity information, which is used for error detection and correction together with the data, and further store the parity information in the database 611. According to an embodiment, each of the DRAM modules 611_1 included in the database 611 may include a plurality of DRAM chips, and each of the plurality of DRAM chips may use an In-DRAM ECC to generate a fail bit indicating whether or not the DRAM chip has failed. In addition, each of the DRAM modules 611_1 provided in the database 611 may generate fail information in the above-described embodiment through a calculation operation using the fail bit.

Data and parity information (or a parity code) may be read from the database 611 through a read operation on the database 611, and the read data and parity information may be provided to the host 612. In addition, the fail information and/or the fail bit may be provided to the host 612 in accordance with the embodiments described above, and thus, a fail state occurring in the database 611 may be reported to the host 612. The host 612 may recover data of a failed DRAM chip by using received various types of information.

In other embodiments of the invention, the system level ECC engine may be formed on the module board on which the memory chips (e.g., DRAM chips) are mounted. For example, in the embodiments described above with respect to FIGS. 1, 2, 3, 6 and 7, ECC engines 11_1, 111, 211, 311 and 411 may be formed on module boards of memory devices 12, 120, 220, 320 and 420, respectively. The memory devices may be a memory module and/or a semiconductor package. Each such system level ECC engine may operate as described herein, to identify and correct bit errors in the predetermined unit of data (e.g., multi-chip data obtained from multiple ones of the DRAM chips) using the fail bits (e.g., M fail bits Fail [1:M] from the M DRAM chips) and/or fail information Info_F. The system level ECC engine may communicate with an RCD (e.g., 322, 422) via signal wiring formed on the module board (e.g., when the system level ECC engine and RCD are formed as separate chips). In some examples, the system level ECC engine may be integrally formed with an RCD as part of the same integrated circuit of the same chip and communicate via internal circuitry of this chip.

Thus, the memory device (e.g., 10, 100, 200, 300 and 400) may output multi-chip data DATA that has been subject to error correction by the system level ECC engine (e.g., using the fail bits and/or fail information Info_F). In some examples, the fail bits and/or fail information Info_F may still be output to an external device (e.g., memory controller or host) so that the external device may identify a defective DRAM chip and take corrective action (e.g., determine extent of defect of a DRAM chip and/or store data of a DRAM chip in other locations and/or adjust a logical address space to avoid use of the defective DRAM chip). FIGS. 18 to 20C illustrate various embodiments of the inventive concept.

Figure 18:
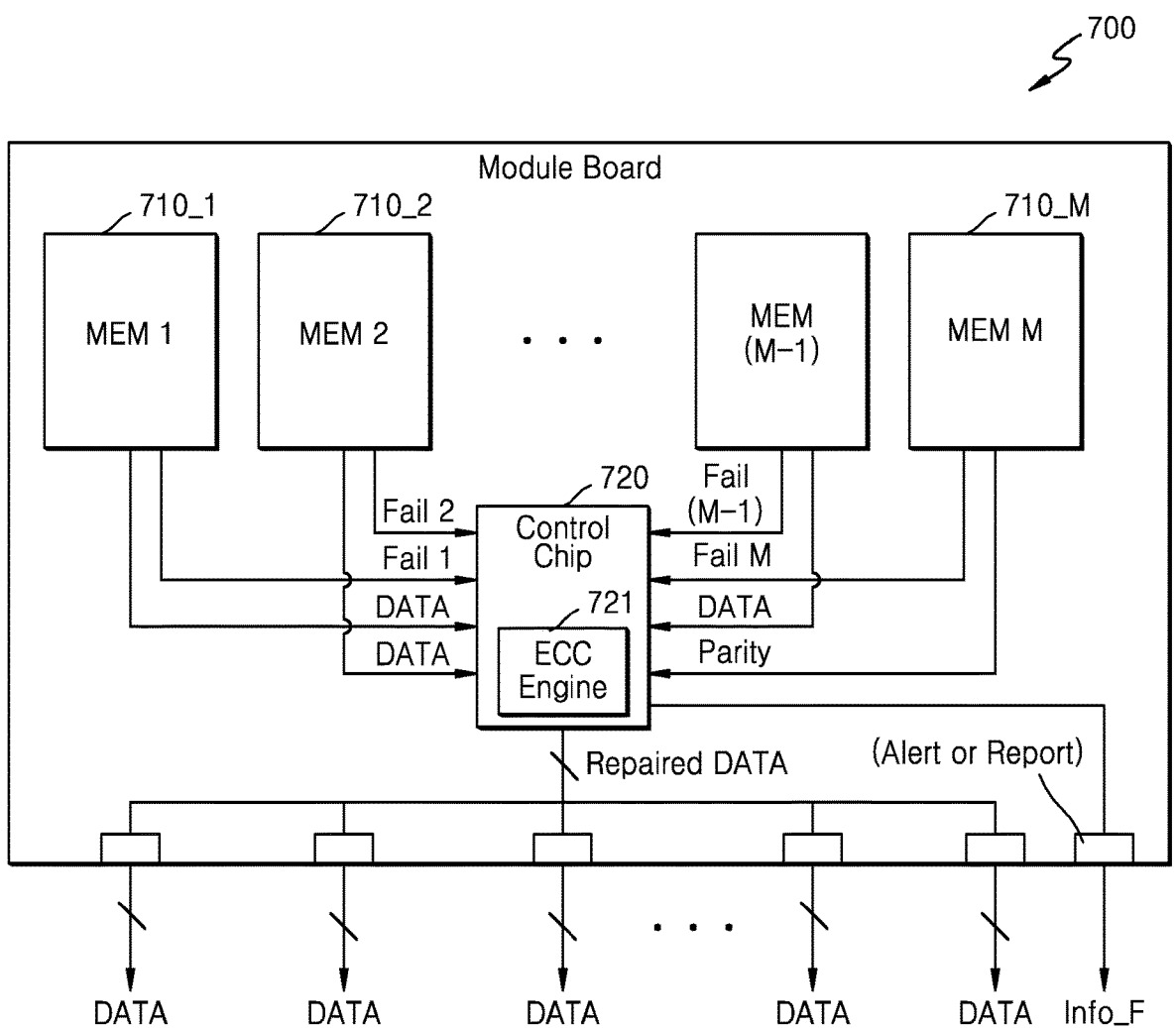
FIG. 18 is a block diagram illustrating an implementation of a memory module according to another embodiment of the inventive concept.

FIG. 18 is a block diagram illustrating an implementation of a memory module 700 according to another embodiment of the inventive concept.

Referring to FIG. 18, the memory module 700 may include M memory chips 710_1 to 710_M mounted on a module board, and each of the memory chips 710_1 to 710_M may be a DRAM chip. For example, the memory chips 710_1 to 710_M may be the same as and perform the same operations of the M DRAM chips described with respect to other embodiments herein. Further, the memory chips 710_1 to 710_M may be memory chips other than DRAM chips, such as those as described elsewhere herein. In addition, the memory module 700 may further include a control chip 720, and the control chip 720 may include an ECC engine 721. The control chip 720 may include an RCD and perform the function of an RCD as described in the above embodiments described. Specifically, ECC engine 721 and the RCD may be circuits of the integrated circuit of the control chip 720.

In a manner that is substantially the same as that in the embodiments described above, the memory chips 710_1 to 710_M may store data DATA and a parity code Parity. As an example, the memory chip 710_M, which is an M-th memory chip, may store the parity code Parity and the other memory chips may store the data DATA. However, embodiments of the inventive concept are not limited thereto, the data DATA and the parity code Parity may be stored using other methods (such as alternatives described herein).

Each of the memory chips 710_1 to 710_M may include an In-DRAM ECC and fail bits Fail 1 to Fail M from the memory chips 710_1 to 710_M may be provided to the control chip 720. Furthermore, the data DATA and the parity code Parity, read from the memory chips 710_1 to 710_M, may be further provided to the control chip 720.

The control chip 720 may determine a memory chip, in which an error has occurred, among the memory chips 710_1 to 710_M through the fail bits Fail 1 to Fail M, and may perform the fail recovery operation according to the embodiments described above. As an operation example, a fail may be recovered through the parity code Parity and the remaining data except for the data of the memory chip, in which an error occurred, among the memory chips 710_1 to 710_M. In this way, the memory module 700 may provide fail-recovered data to a host (or another external device, such as a memory controller).

As an operation example, the control chip 720 may generate fail information Info_F by performing arithmetic processing on the fail bits Fail 1 to Fail M according to the embodiments described above and may also provide the fail information Info_F to the host (or the memory controller). In an implementation, the memory module 700 may include various terminals (also referred to as pins), and at least one pin may be used as an error report pin to output the fail information Info_F in real time. As used herein, a pin comprises an electrical terminal of a device (e.g., for signal communications) and need not take a prong shape (e.g., a solder ball may be a pin). As an example, the fail information Info_F may be output through an alert pin defined in a DRAM specification, or the failure information Info_F may be output through an error report pin as described in the embodiments described above.

The memory device 700 may be a memory module and/or memory package. The memory device 700 may comprise a plurality of pins formed on the module board to communicate with an external device. As shown in FIG. 18, the pins of the memory device 700 may be located at an edge of the memory device 700 (bottom edge in FIG. 18). The pins of the memory device 700 may thus form an edge connector which may plug into an edge connector socket (e.g., of a motherboard of a computer). In some examples, the memory device 700 may comprise an encapsulant, such as a resin molding compound, that covers and encases at least one side of the memory device (e.g., covering and encasing all of the memory chips mounted on the module board). From a top down perspective of FIG. 18, the resin molding compound may have a footprint that is the same as or larger than the footprint of the module board.

Figure 19:
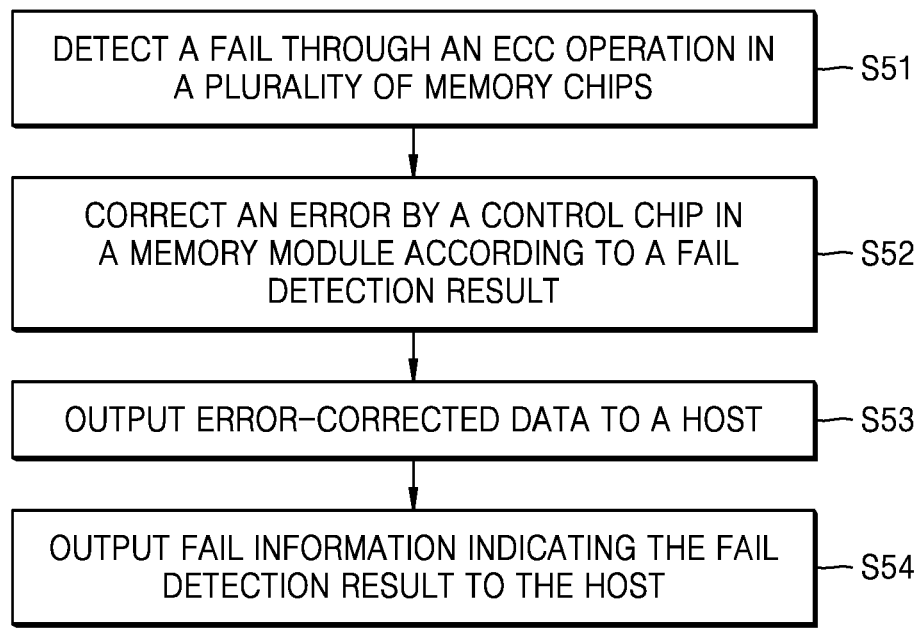
FIG. 19 is a flowchart illustrating a method of operating a memory module, according to an embodiment of the inventive concept.

FIG. 19 is a flowchart illustrating a method of operating a memory module, according to an embodiment of the inventive concept. Referring to FIG. 19, an ECC operation is performed in each of a plurality of memory chips in a memory module (Operation S51). Operation S51 may be the same as described with respect to Operation S11 and an In-DRAM ECC is employed in each of the plurality of DRAM chips, so that error correction and fail detection using the In-DRAM ECC is performed. In Operation S52, an error is corrected by a control chip of the memory module according to a fail detection result. According to the embodiments described above, a control device may be provided in the memory module, and an error correction operation using data, a parity code, and fail bits in an In-DRAM ECC may be performed. The memory module may output error-corrected data to a host (or a memory controller) (Operation S53). According to the embodiments described above, fail information indicating a fail detection result of the memory chips also may be output to the host (or the memory controller) (Operation S54). As an example, fail information including one or more bits may be generated through an operation using fail bits. The fail information may indicate whether a fail has occurred in at least one of the plurality of memory chips.

Figure 20A:
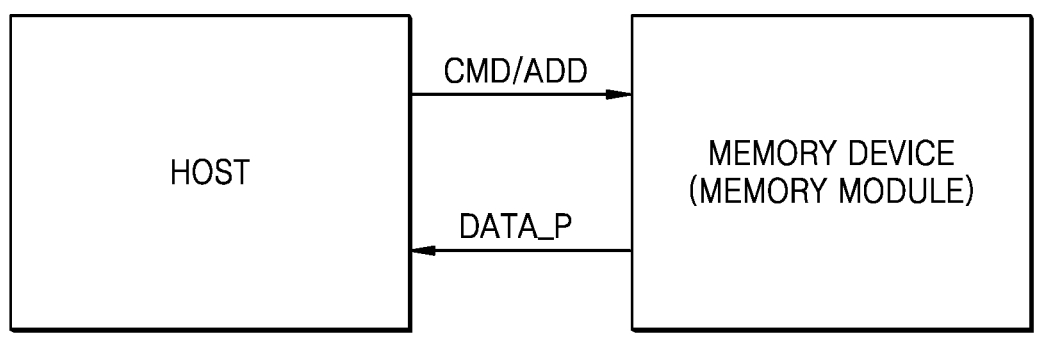
FIGS. 20A, 20B, and 20C illustrate various examples of transmitting fail information.
Figure 20B:
Figure 20C:
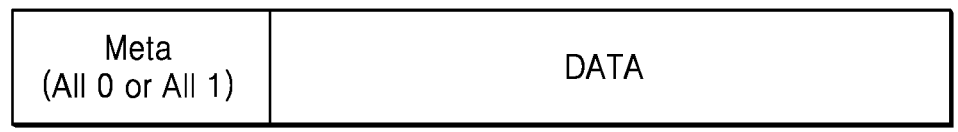

FIGS. 20A, 20B, and 20C illustrate various examples of transmitting fail information. Referring to FIG. 20A, a host provides a command (CMD) and an address ADD to a memory device (e.g., a memory module), and the memory device reads data DATA and a parity code Parity from a plurality of memory chips included in the memory device, according to the embodiments described above. Also, the memory device may generate a data packet DATA_P including at least a part of the read data and transmit the data packet DATA_P to the host. In the example of FIG. 20A, a recovery process (or error correction) using a parity code Parity may be performed in the host or in the memory device. The data packet DATA_P may be formed as a plurality of bits that are transmitted serially, such as on a single pin (e.g., error report pin).

Referring to FIG. 20B, the data packet DATA_P may include metadata in addition to data. In addition, fail information Info_F that may be generated according to the embodiment described above may be further included in the data packet DATA_P. As an example, the metadata may include information recorded by the host, and the fail information Info_F may include information on whether or not any of the memory chips fail and/or which of the memory chips have failed.

Referring to FIG. 20C, the data packet DATA_P may include metadata in addition to data. In the case where at least one memory chip fails, separate fail information Info_F may not be generated but information indicating whether or not the memory chips fail may be provided to the host through processing of the metadata. As an example, by having the metadata have a certain bit have a predetermined value, the host may determine whether or not any of the memory chips have failed. As an example, when all bit values of the metadata have '0' or '1', it may indicate that at least one memory chip has failed. As another example, the metadata may comprise a plurality of bits, where each bit represents whether or not a corresponding one of the memory chips has failed (e.g., corresponding to a predetermined value of '0' or '1' respectively).

While the inventive concept has been particularly shown and described with reference to embodiments thereof, it will be understood that various changes in form and details may be made therein without departing from the spirit and scope of the following claims.

What is claimed is:

1. A memory module comprising:
   first to Mth memory chips (where M is an integer that is equal to or greater than 2), each of which includes an in-memory error correction circuit configured to generate a fail bit through an intra-chip error detection operation; and
   a buffer chip that configured to receive the fail bits from the first to Mth memory chips and to report to a host whether at least one of the first to Mth memory chips fails, based on the fail bits.

2. The memory module of claim 1, wherein the buffer chip is configured to generate fail information according to a result obtained from the fail bits and provide the fail information to the host.

3. The memory module of claim 2, wherein the fail information comprises a bit having a first logic value indicating at least one memory chip has failed and having a second logic value indicating a failed memory chip is not present.

4. The memory module of claim 2, further comprising an error report pin in signal communication with the buffer chip to provide the fail information to the host.

5. The memory module of claim 4, wherein the error report pin is an alert pin as defined in a DRAM specification.

6. The memory module of claim 4, wherein the memory module is a non-volatile dual in-line memory module (NVDIMM), and the error report pin is an error report pin defined in association with an operation of a non-volatile memory of the NVDIMM.

7. The memory module of claim 1, wherein the buffer chip is configured to temporarily stores the received fail bits and to output the fail bits to the host in response to a request from the host.

8. The memory module of claim 7, further comprising M first ports corresponding to the first to Mth memory chips and an additional second port including a plurality of pins, wherein the fail bits are provided to the host via the second port.

9. The memory module of claim 1, wherein at least one of the first to Mth memory chips is a parity chip configured to store a parity code for recovering data of a memory chip in which a fail in chip units occurs, and the remaining memory chips are memory chips configured to store data.

10. The memory module of claim 9,
    wherein the Mth memory chip of the first to Mth memory chips correspond to the parity chip,
    wherein code information for correcting at least one of a random error and a multi-bit error each generated in the first to (M−1)th memory chips is further stored in the Mth memory chip.

11. The memory module of claim 9, wherein a data packet including the data and metadata is provided to the host and the reporting is performed by having the metadata have a certain bit have a predetermined value when at least one of the memory chip fails.

12. A memory module comprising:
    first to Mth memory chips (where M is an integer that is equal to or greater than 2), each of which includes an in-memory error correction circuit configured to generate a fail bit through an intra-chip error detection operation; and
    a control chip configured to receive the fail bits and configured to receive data and a parity code from the first to M memory chips, and configured to correct one or more bit errors of the received data based on the fail bits and the parity code, and provides repaired data to a host.

13. The memory module of claim 12, wherein the control chip is configured to report to the host whether at least one of the first to Mth memory chips fails, based on the received fail bits.

14. The memory module of claim 13, wherein the control chip is configured to generate fail information according to a result obtained by calculating the fail bits and configured to provide the fail information to the host.

15. The memory module of claim 14, further comprising an error report pin in communication with the control chip to provide the fail information to the host.

16. The memory module of claim 13,
    wherein the control chip is configured to generate a data packet including the data and metadata and transmit the data packet to the host, and
    wherein the control chip is configured to report to the host whether at least one of the first to Mth memory chips fails by having the metadata have a certain bit have a predetermined value when the at least one of the memory chips fails.

17. The memory module of claim 12,
    wherein the control chip comprises an error correction code (ECC) engine that is configured to receive the data and the parity code and to correct the data based on the parity code and the fail bits.

18. The memory module of claim 12, wherein the control chip is configured to provide the fail bits to the host in response to a command from the host.

19. A method of operating a memory module including a plurality of memory chips and a control chip, each of the plurality of memory chips including an in-memory error correction circuit, the method comprising:
- by the control chip, reading data and a parity code from the plurality of memory chips;
- by the control chip, obtaining fail bits, each fail bit indicating whether a corresponding one the plurality of memory chips fail;
- by the control chip, repairing data of a failed memory chip determined based on the fail bits, by using the read data and the parity code; and
- providing the repaired data to a device external to the memory module.

20. The method of claim 19, further comprising reporting to the external device whether at least one memory chip fails by providing the external device with fail information according to a result obtained from the fail bits.

* * * * *